United States Patent [19]
Asai et al.

[11] Patent Number: 6,159,861
[45] Date of Patent: *Dec. 12, 2000

[54] METHOD OF MANUFACTURING SEMICONDUCTOR DEVICE

[75] Inventors: Shuji Asai; Hirokazu Oikawa, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/141,328

[22] Filed: Aug. 27, 1998

[30] Foreign Application Priority Data

Aug. 28, 1997 [JP] Japan .................................. 9-231955

[51] Int. Cl.[7] .................................................. H01L 21/302
[52] U.S. Cl. .......................... 438/706; 710/712; 710/718
[58] Field of Search ..................................... 438/706, 743, 438/585, 584, 710, 712, 718

[56] References Cited

U.S. PATENT DOCUMENTS

| | | | |
|---|---|---|---|
| 4,324,038 | 4/1982 | Chang et al. | 438/286 |
| 4,689,115 | 8/1987 | Ibbotson et al. | 438/706 |
| 4,902,377 | 2/1990 | Berglumd et al. | 438/640 |
| 4,943,344 | 7/1990 | Tachi et al. | 156/643 |
| 5,512,500 | 4/1996 | Oyamausu | 438/585 |
| 5,514,621 | 5/1996 | Tabara | 438/585 |
| 5,541,127 | 7/1996 | Hoshiko et al. | 438/585 |
| 5,705,414 | 1/1998 | Lustig | 438/585 |
| 5,744,402 | 4/1998 | Fukazawa et al. | 438/734 |
| 5,766,988 | 6/1998 | Cho et al. | 438/159 |
| 5,767,006 | 6/1998 | Lee | 438/597 |
| 5,841,196 | 11/1998 | Gupta et al. | 257/774 |
| 5,849,641 | 12/1998 | Arnett et al. | 438/734 |
| 5,851,872 | 12/1998 | Chen et al. | 438/253 |
| 5,877,092 | 3/1999 | Lee et al. | 438/738 |
| 5,915,204 | 6/1999 | Sumi | 437/200 |

FOREIGN PATENT DOCUMENTS

| | | | |
|---|---|---|---|
| 63-174374 | 7/1988 | Japan . | |
| 1-228133 | 9/1989 | Japan | H01L 21/306 |
| 6-45293 | 2/1994 | Japan . | |
| 6-318605 | 11/1994 | Japan | H01L 21/338 |

OTHER PUBLICATIONS

"Plasma Chemistry in ULSI Age", published by Kogyo Chosakai, pp. 75–93, 1983.
"Semiconductor World," Mar. 1996, pp. 19–24.

*Primary Examiner*—Benjamin L. Utech
*Assistant Examiner*—Lynette T. Umez-Eronini
*Attorney, Agent, or Firm*—Sughrue, Mion, Zinn, Macpeak & Seas, PLLC

[57] ABSTRACT

In a method of manufacturing a semiconductor device which has a semiconductor substrate, a channel layer formed on the semiconductor substrate and an insulating film deposited on the channel layer, an opening corresponding to a gate electrode pattern is formed in the insulating film by the use of a photoresist film. The channel layer contains crystal components while the photo-resist film contains carbon. The insulating film is etched to exposed said channel layer after removing the photoresist film. In consequence, no reacted production is formed between the crystal components and the carbon on the exposed channel layer.

29 Claims, 16 Drawing Sheets

METHOD OF MANUFACTURING SEMICONDUCTOR DEVICE

BACKGROUND OF THE INVENTION

This invention relates to a method of manufacturing a semiconductor device, and in particular, a method of forming an electrode of a compound semiconductor device, such as, a Schottky junction field effect transistor (MESFET metal-semiconductor field effect transistor) and a hetero junction field effect transistor (HJFET).

Recently, devices which utilize high frequency of 0.5 GHz or more, such as, a portable telephone, a portable information terminal and a satellite communication I broadcast receiver have been widely used. In this event, a compound semiconductor device which is advantageous in performance, such as, electric power efficiency is used as the above device because a small size and lower power consumption are required in such devices.

Under such a circumstance, it is necessary that characteristics of the devices are uniform to each other to achieve designed performance in circuit devices which are mass-produced. The production of this device can not comply with manual adjustment of the characteristic in the course of a manufacturing step. Therefore, it is required to statistically control the step by the use of a processing apparatus having high accuracy, and namely to improve processing accuracy of each step. In addition, it is extremely important to apply a process which is capable of suppressing variation of the characteristic.

In the general method of manufacturing the MESFET, a gate electrode is formed by the use of the dry etching, such as, the reactive ion etching (RIE). Specifically, a semiconductor layer is exposed by forming a gate opening in an insulating film by the use of the RIE. In this event, when the semiconductor layer is exposed on the condition that anisotropy is strong, the channel crystal layer is damaged due to ion impact. In consequence, carriers on the surface thereof are unevenly reduced. In this case, it is difficult to recover the damage by the heat treatment. Further, the manufacturing yield is degraded because the device characteristic of the FET becomes uneven.

To solve this problem, a variety of suggestions have been made about the anisotropy dry-etching method which utilizes microwave with low damage, such as, the electron cyclotron resonance (ECR). By the using the ECR method, the etching can be carried out with low damage.

Meanwhile, the epitaxial apparatus for the mass-production has been developed with advancement of the compound semiconductor device. In particular, it is possible to produce a thin-film having high impurity concentration by the use of the metal organic chemical vapor deposition (MOCVD) with high accuracy and reproducibility. In this condition, a fine gate electrode is arranged on the conductive semiconductor layer of the thin-film having the high impurity concentration to produce the FET having high transconductance gm and cut-off frequency $f_T$ with high reproducibility.

Therefore, the ECR dry etching has been attempted to be utilized by using the epitaxial semiconductor substrate which is fabricated by the use of the MOCVD. Namely, when the insulating film is etched or opened, the RIE method is first carried out until the insulating film of 100 nm is left so as to not damage the semiconductor layer. Thereafter, the ECR method is performed to expose the semiconductor layer.

However, reacted product is generated on the surface of the semiconductor layer (namely, channel layer) after the etching. Where the reacted product is left on the Schottky electrode forming region, a forward current does not flow even when the forward bias is applied by forming the Schottky electrode. Therefore, an excellent Schottky barrier is not formed in this condition. Consequently, the gate function can be obtained.

On the other hand, suggestion has been made about another method of forming the gate electrode. In this method, after the insulating film is left with the preselected region, the wet etching is carried out to expose the semiconductor layer. In this case, the two kinds of insulating films are deposited to prevent the opening from unevenly widening by the isotropic wet etching.

However, in this method, the side etching takes place in the insulating film by the use of the wet etching. Consequently, vaporized electrode metal is cut out with the step-shape in the side-etching portion.

Further, suggestion has been made about the other method of forming the gate electrode. In this method, a sloped side surface is used in order to improve the connection of the vaporized metal in the gate-opening portion. Thereby, a reduced gate opening which has the sloped side surface on an upper portion of the opening can be formed on the condition that the sloped curve surface is kept.

However, the side etching brings about in the bottom portion because the isotropic etching is carried out for the insulating film. Consequently, the vaporized metal does not almost enter into the opening. As a result, the metal of the side surface becomes thin and thereby, the series resistance becomes large.

As mentioned before, when the semiconductor layer (crystal surface of compound semiconductor) is exposed by the dry etching, the reacted product is formed by the crystal components and the carbon. Consequently, the excellent Schottky barrier can not be formed.

Further, when the electrode is formed in the fine opening, it is difficult that the vaporized electrode metal entirely or completely attaches on the side surface. In consequence, the electrode inevitably becomes thin. As a result, the series resistance is increased and the disconnection of the electrode often takes place.

SUMMARY OF THE INVENTION

It is therefor an object of this invention provide a method of manufacturing a compound semiconductor device which is capable of equalizing threshold voltages $V_T$ of FETs in a surface thereof or between wafers.

It is another object of this invention to provide a method of manufacturing a compound semiconductor device which is capable of suppressing increase of series resistance of a fine electrode.

It is another object of this invention to provide a method of manufacturing a compound semiconductor device which is capable of improving productivity of a compound semiconductor device.

According to this invention, a semiconductor device has a semiconductor substrate, a channel layer formed on the semiconductor substrate and an insulating film deposited on the channel layer. In this event, an opening corresponding to a gate electrode pattern is formed in the insulating film by the use of a photo-resist film. Herein, the channel layer contains crystal components while the photo-resist film contains carbon. In this condition, the insulating film is etched to expose the channel layer after removing said photo-resist film. In consequence, no reacted product is formed between the crystal components and the carbon on the exposed channel layer.

More specifically, the channel layer is formed on the semiconductor substrate. Further, the insulating film is deposited on the channel layer. Moreover, a photo-resist film is formed on the insulating film. In this event, the photo-resist film has a first opening corresponding to a gate electrode pattern.

Next, a second opening is formed in the insulating film by the use of a first etching process by using said photo-resist film as a mask. Consequently, the insulating film is left with a preselected thickness. Thereafter, the photo-resist film is removed.

Subsequently, the remaining insulating film is etched by the use of a second etching process so as to expose the channel layer. Finally, the gate electrode pattern is formed on the exposed channel layer.

In this case, the second etching process is lower in damage against the semiconductor substrate than the first etching process. For instance, the first etching process comprises the reactive ion etching (RIE) method. On the other hand, the second etching process comprises at least one selected from the group consisting of the electron cyclotron resonance (ECR) method; the inductive coupled plasma (ICP) method and the helicon method.

Thus, the opening is formed in the insulating film by the use of the photo-resist film on the condition that the insulating film is left with the preselected thickness. After the photo-resist film is removed, the remaining insulating film is removed by using the etching with the low damage. In consequence, the reacted product is not formed by the crystal components and the carbon on the exposed channel layer. Therefore, the excellent Schottky barrier can be formed between the exposed channel layer and the gate electrode pattern.

Further, it is unnecessary to add the oxygen to the etching gas or to additionally carry out the oxygen plasma process in order to avoid the generation of the reacted product. Thereby, the film reduction due to the oxidation of the crystal surface or the roughness of the surface can be prevented. Consequently, the threshold voltage $V_T$ becomes shallow to keep the uniformity. This results in the improvement of the manufacturing yield.

Further, a slope is formed on the upper portion of the opening in this invention. Thereby, the vaporized electrode metal can be readily embedded in the opening via the slope, and the disconnection of the electrode can be avoided. In addition, the increase of the resistance can be effectively suppressed.

DESCRIPTION OF THE PREFERRED EMBODIMENTS:

Referring to FIGS. 1 through 9, conventional methods of manufacturing compound semiconductor devices will be first described for a better understanding of this invention. The manufacturing methods are equivalent to the conventional manufacturing methods mentioned in the preamble of the instant specification.

(First conventional example)

A first conventional example is the most general method of manufacturing the MESFET and is disclosed in Japanese Unexamined Patent Publication No. Hei. 6-45293.

Referring to FIGS. 1A through 1D, a description will be provide about the first conventional example.

Figure 1A:
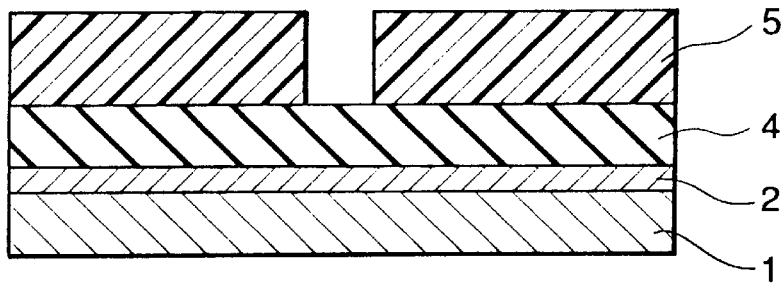
FIGS. 1A through 1D are cross sectional views showing a method of a compound semiconductor device according to a first conventional example.

As illustrated in FIG. 1A, a channel layer (conductive semiconductor layer) 2 is formed on a semiconductor substrate 1 by the use of the known epitaxial growth method or the known ion implantation method. Herein, it is to be noted that the semiconductor substrate 1 is formed by the use of a semi-insulating GaAs substrate while the channel layer 2 is formed by an n-type GaAs.

Thereafter, an insulating film 4 which is formed by a silicon oxide film ($SiO_2$) is deposited on the channel layer 2 by the use of the known chemical vapor deposition (CVD)

method. Subsequently, a photo-resist film 5 which has an opening corresponding to a gate electrode pattern is formed thereon, as shown in FIG. 1A.

Figure 1B:
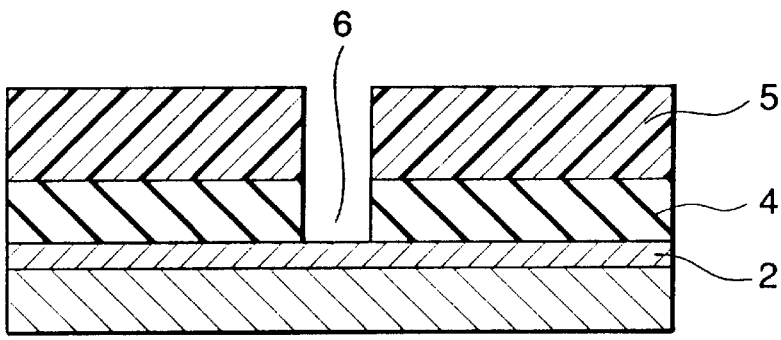

Next, as illustrated in FIG. 1B, an anisotropy dry-etching process due to the reactive ion etching (RIE) method is carried out for the insulating film 4 by using the photo-resist film 5 as a mask. Thereby, a gate opening 6 is formed so as to expose a surface of the channel layer 2, as shown in FIG. 1B. Herein, mixed gases with $CHF_3$ and $O_2$ are used in the RIE method.

Figure 1C:
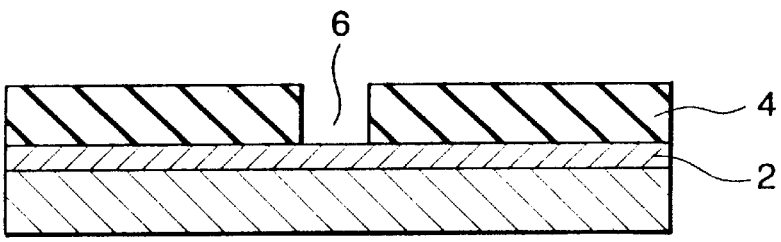

Subsequently, the photo-resist film 5 operable as the mask is removed by the use of an organic solvent, as illustrated in FIG. 1C.

Figure 1D:
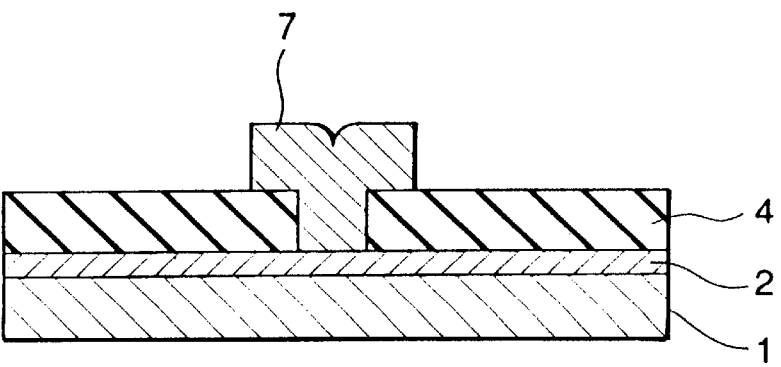

Successively, as shown in FIG. 1D, a metal film for forming a schottky junction with the exposed semiconductor layer is deposited by the use of the sputtering method or the vaporizing method due to the electron gun. Thereafter, the metal film is dry-processed by the use of the ion milling or the RIE method by using a photo-resist pattern (not shown) as a mask to form a gate electrode 7.

Next, although not shown in FIG. 1D, source and drain electrodes which ohmic-contact with the channel layer 2 are formed on both sides of the gate electrode 7. Thus, the MESFET is completed in the first conventional example.

Herein, description will be made about a principle of the RIE method. The principle is disclosed, for example, in "plasma chemistry in ULSI age", published by Kogyo Chosakai, pp. 86–87.

Specifically, a vicinity of an anode is in a plasma generating state containing ions and electrons in the glow discharge between the parallel flat plates under low gas pressure. On the other hand, a vicinity of a cathode is negatively charged because emitted second electrons are collected. This phenomenon is called an ion sheath. Thereby, a large electric field is concentrated by a space electric charge.

In this condition, the etching process is carried out by the use of both the physical sputtering effect and the chemical reaction. In this event, a cation is accelerated so as to impact with a substrate film in the physical sputtering effect while a radical absorbs on the substrate surface in the chemical reaction.

In this case, the etching becomes anisotropy because the acceleration is performed by the electric field due to the ion sheath. Therefore, damage takes place for the substrate by the impact with the accelerated ions. In this event, energy in addition to mass is also large because of the energy in the ion-state.

Meanwhile, a voltage of the ion-sheath can be monitored, and is also called a self-bias voltage or a substrate voltage. In order to enhance the anisotropy by raising up the ion sheath voltage, the gas pressure must be lowered or a distance between the electrodes must be made narrow. In the reverse case, the self-bias voltage becomes small, and as a result, the damage against the crystal substrate can be weakened.

However, the anisotropy becomes weak to enhance the isotropic in the above-mentioned technique. In addition, the controllable ion-sheath voltage has a limit because the gas pressure which generates a stable glow discharge has a suitable range.

When the opening is formed in the insulating film by the use of the RIE method, if the semiconductor crystal surface is exposed on the condition that the anisotropy is strong by enhancing the ion sheath voltage, the channel crystal layer is damaged by the ion impact. Consequently, the carriers near the surface are unevenly reduced. This damage can not be completely recovered by the heat treatment. As a result, the manufacturing yield is degraded because the device characteristic of the FET becomes uneven.

In order to avoid this problem, verification experiment was carried out on the condition that the etching process was first carried out under high anisotropy condition so that the insulating became thin. Thereafter, the etching process was finally performed on the condition that the ion sheath voltage was lowered by enhancing the gas pressure to form a final opening in the insulating film.

In this case, the conductive semiconductor layer which was formed by ion implantation or the epitaxitial growth could not be accurately controlled. Therefore, the semiconductor layer was adjusted by making the semiconductor layer thick and grinding the semiconductor layer by the etching from the opening. Herein, the adjustment was carried out by measuring a current.

In this event, the surface of the semiconductor layer which was damaged could be etched. However, in this method, the productivity and the accuracy of the device characteristic were inevitably degraded. Further, it was difficult to improve performance, such as, transconductance gm and cut-off frequency $f_T$ by shortening the gate length and thinning the layer.

Meanwhile, a variety of suggestions have been recently made about the anisotropy dry-etching methods which utilizes microwave with low damage by using a principle different from the-parallel flat plate type RIE. For instance, these methods are disclosed in Proceeding titled "semiconductor world", March 1996, pp. 19–24 and the above-mentioned Proceeding, pp. 79–80.

These methods are classified into the electron cyclotron resonance (ECR) method, the inductive coupled plasma (ICP) method, and the helicon method in accordance with the principle for generating the plasma.

The ECR method will be described in detail.

In the ECR method, the electron cyclotron resonance works by applying the microwave to electrons in a magnetic field. Thereby, plasma having high density can be obtained under the low gas pressure in comparison with the RIE.

In the ECR etching, moving directions of the ions can be completed by placing the substrate in the ECR position. Thereby, the anisotropy can be strengthened by enlarging the mean free path under the low gas pressure. Further, the etching of the low damage is possible on the condition that the ion sheath is extremely low.

On the other hand, the epitaxial growth apparatus has been developed for the mass-production with the advancement of the compound semiconductor device. In particular, it is possible to produce a thin-film layer of high impurity concentration by the use of the MOCVD method with the high accuracy and the excellent repeatability. In this condition, it is required to produce the FET having the transconductance gm and the cut-off frequency $f_T$ with the excellent repeatability by arranging the fine electrode on the conductive semiconductor layer of the highly-doped impurity concentration.

To this end, the ECR dry-etching method has been attempted by the use of the epitaxial semiconductor substrate which is fabricated by the MOCVD method. Specifically, the etching is carried out to cause no damage by the RIE method during opening the $SiO_2$ film so that the $SiO_2$ film of 100 nm is left. Thereafter, the etching is performed by the ECR method. In this event, the ECR dry-etching was carried out with gas which is mixed $CF_4$ with $O_2$ of 3% under the pressure of 1 m Torr so that a polymer having strong polymerization degree does not take place on the $SiO_2$ film.

Figure 2:
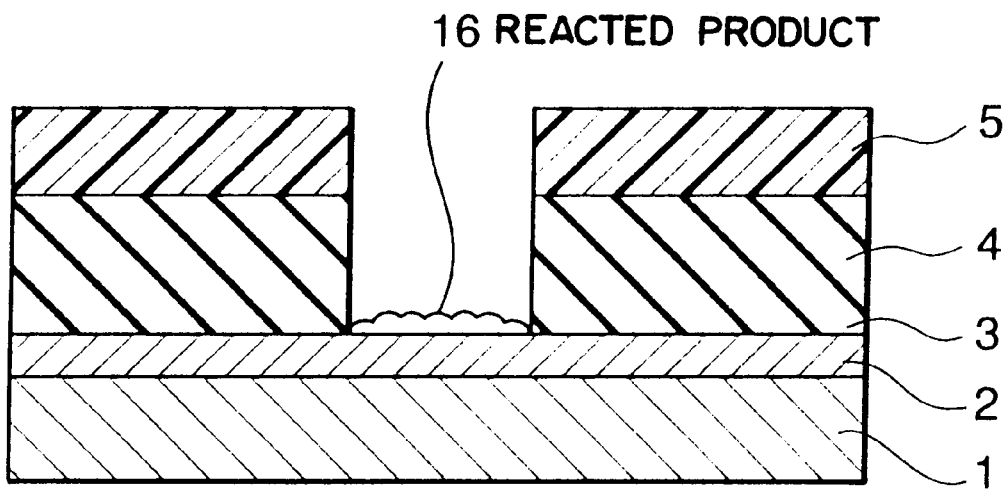
FIG. 2 is a cross sectional view for explaining a problem of a first conventional example.

However, when the inside of the opening is observed after the above etching, a reacted product 16 is brought about on the channel layer 2 (GaAs crystal surface), as illustrated in FIG. 2. As a result of Auger analysis, it is confirmed that the reacted product 16 is formed by Ga, As as the crystal components, and carbon.

Such a reacted product does not melt by the organic washing process or the dilution hydrochloric acid and is left on the channel layer 2, as shown in FIG. 2. When the reacted product is left in the schottky electrode forming region of the gate, even if the forward bias is applied to the schottky electrode, the forward current does not flow. In consequence, an excellent schottky barrier can not be formed in this state. As a result, the gate function can not be obtained.

Figure 3:
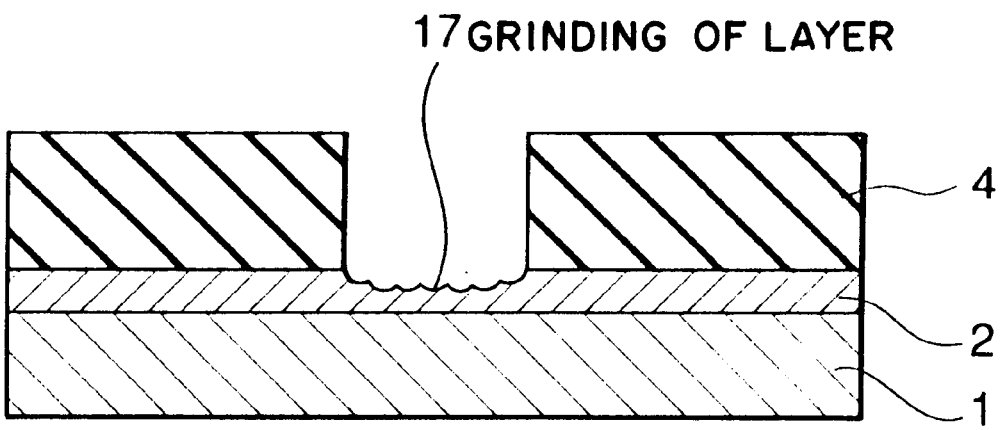
FIG. 3 is a cross sectional view for explaining a problem of a first conventional example.

To this end, when an ashing process due to oxygen plasma is carried out for the reacted product 16, the semiconductor crystal is oxidized in addition to the reacted product 16. In this condition, when the reacted product 16 is removed by dissolving in the dilution hydrochloric acid, grooves 17 take place on the crystal surface of the channel layer 2, as illustrated in FIG. 3. Consequently, the surface of the channel layer 2 becomes rough.

Further, when the channel layer 2 becomes thin by oxidizing and melting, the threshold voltage $V_T$ of the FET becomes shallow to degrade the uniformity. Such a reacted product 16 is brought about even when $SF_6$ gas containing no carbon is used.

When oxygen rate which is mixed in the ECR dry etching is 10% or more as the other method, generation of the reacted production is suppressed. However, the semiconductor crystal is oxidized, and the oxide is etched by melting in the dilution hydrochloric acid, like the above-mentioned plasma process. Moreover, the above-mentioned phenomenon occurs when the semiconductor surface is exposed on the condition that the gas pressure is increased and the ion sheath voltage is lowered by the RIE method.

In addition, it has been confirmed that the phenomenon that the reacted product 16 is formed by the above crystal components and the carbon is generated in an InP based crystal other than the GaAs based crystal.

(Second conventional example)

Another suggestion has been made about the method of forming the gate electrode in the above-mentioned Japanese Unexamined Patent Publication No. Hei. 6-45293. Specifically, two kinds of insulating films which are different from each other in the etching performance are deposited to solve a problem that an opening is unevenly widen by the isotropic wet-etching.

Referring to FIGS. 4A through 4D, description will be provide about the second conventional example.

Figure 4A:
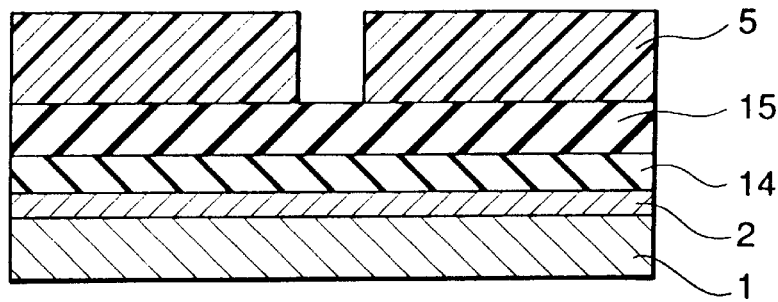
FIGS. 4A through 4D are cross sectional views showing a method of a compound semiconductor device according to a second conventional example.

As illustrated in FIG. 4A, a channel layer 2 is formed on a semiconductor substrate 1. Next, a first insulating film 14 and a second insulating film 15 are successively deposited on the channel layer 2, as shown in FIG. 4A. Herein, it is to be noted that the first insulating film 14 is formed by a silicon oxide film ($SiO_2$) while the second insulating film 15 is formed by a silicon nitride film ($SiN_x$). Thereafter, a photo-resist film 5 which has an opening for a gate forming region is formed thereon, as shown in FIG. 1A.

Figure 4B:
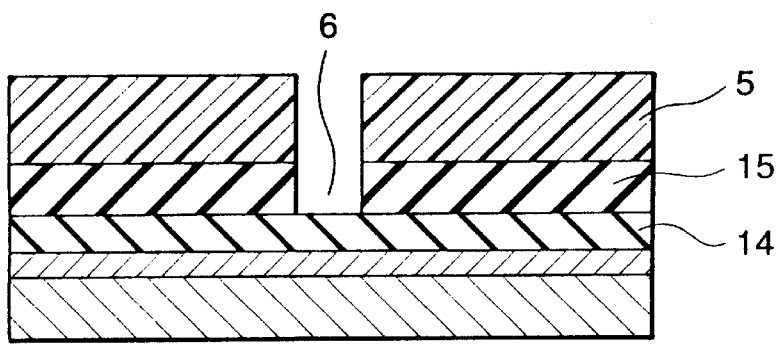
Figure 4C:
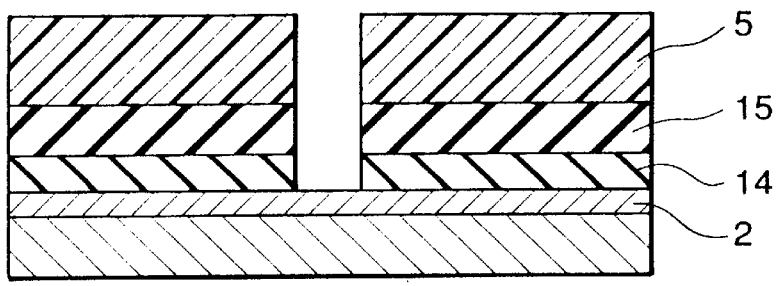

Subsequently, a gate opening 6 is formed in the second insulating film 15 by the use of the RIE method, as illustrated in FIG. 4B. Herein, the RIE method is carried out by using a mixed gas with CHF, and $O_2$. In this event, the first insulating film 14 is left because etching rate is slow, as illustrated in FIG. 4B.

Next, the first insulating film 14 is wet-etched by the use of buffered hydrofluoric acid which is mixed with ammonium fluoride to expose a surface of the channel layer 2. In this case, the dimension of the gate opening 6 can be kept constant because the etching rate of the second insulating film 15 is slow.

Figure 4D:
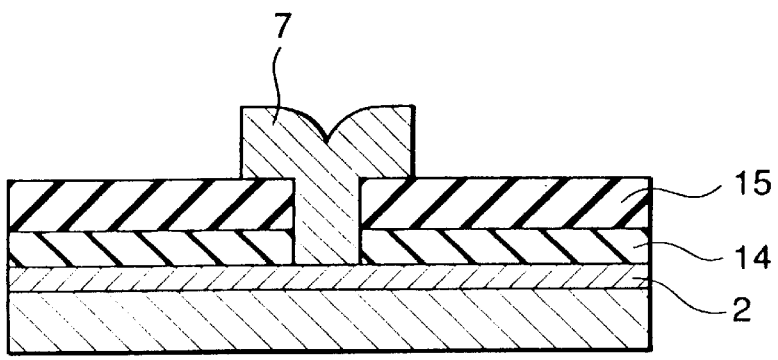

Subsequently, the photo-resist film 5 is removed to form a gate electrode 7, as shown in FIG. 4D. In this example, the channel layer 2 is not damaged to suppress variation of the gate opening by making the first insulating film 14 thin (to 50 nm).

Figure 5:
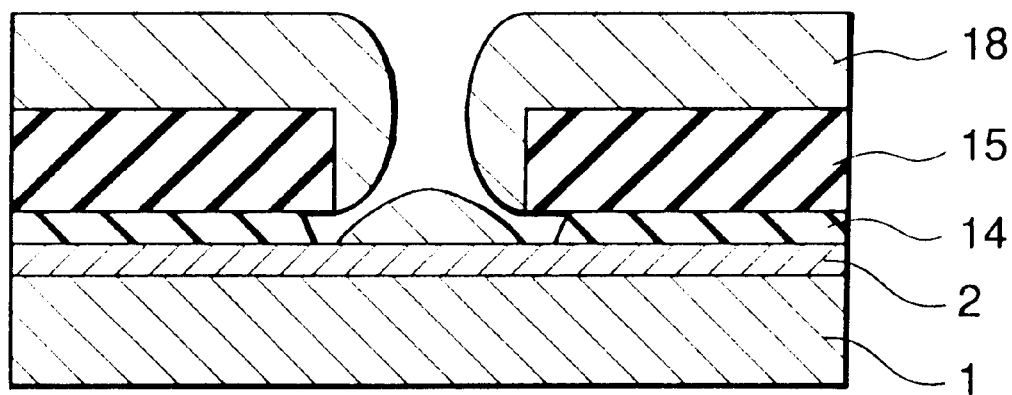
FIG. 5 is a cross sectional view for explaining a problem of a second conventional example.

However, the side etching is carried out for the first insulating film 14 ($SiO_2$) due to the wet etching in this example, as illustrated in FIG. 5. In consequence, the vaporized electrode metal 18 is cut out in the side-etching portion, as shown in FIG. 5.

(Third conventional example)

The other suggestion has been made about a method of forming a fine gate opening by using a sloped side surface to improve connection of a vaporized metal in the gate opening portion in Japanese Unexamined Patent Publication No. Sho. 63-174374.

Referring to FIGS. 6A through 6D, a description will be given about the third conventional example.

Figure 6A:
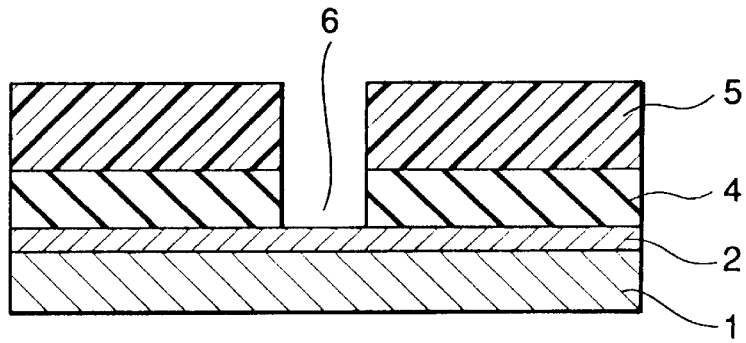
FIGS. 6A through 6D are cross sectional views showing a method of a compound semiconductor device according to a third conventional example.

As illustrated in FIG. 6A, a channel layer 2 is formed on a semiconductor substrate 1. Thereafter, an insulating film 4 is deposited on the channel layer 2. Further, a photo-resist film 5 which has an opening is formed on the insulating film 4.

Subsequently, the anisotropy dry etching is carried out for the insulating film 4 by using the photo-resist as a mask. Consequently, a gate opening 6 is formed in the insulating film 4, as shown in FIG. 1A.

Figure 6B:
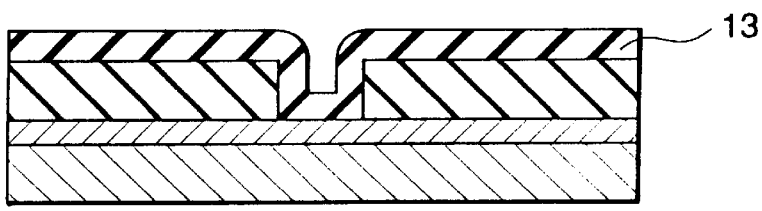
Figure 6C:
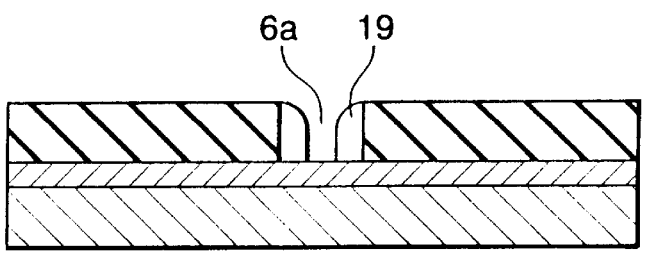

Next, another insulating film 13 for forming a sidewall is deposited on the entire surface of the insulating film 4, as illustrated in FIG. 6B.

Figure 6D:
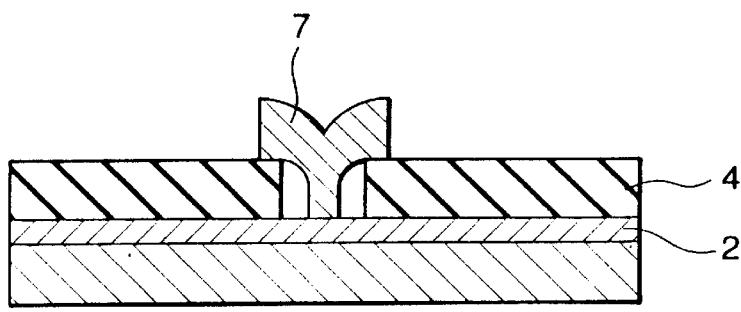

Subsequently, the anisotropy dry etching is carried out, as shown in 6C. Thereby, sidewall-insulating films 19 are formed in the gate opening 6 so as to form narrow gate opening 6a. Next, a gate electrode 7 is formed in the narrow gate opening 6a, as shown in FIG. 6D.

Thus, when another insulating film is deposited in a vertical opening in the insulating film, an edge of the opening portion becomes a curve surface. In this condition, when another insulating film is etched back by the use of the anisotropy dry etching, the sloped curve surface is left so that the narrow opening having the sloped side surface is formed in the opening portion.

Figure 7:
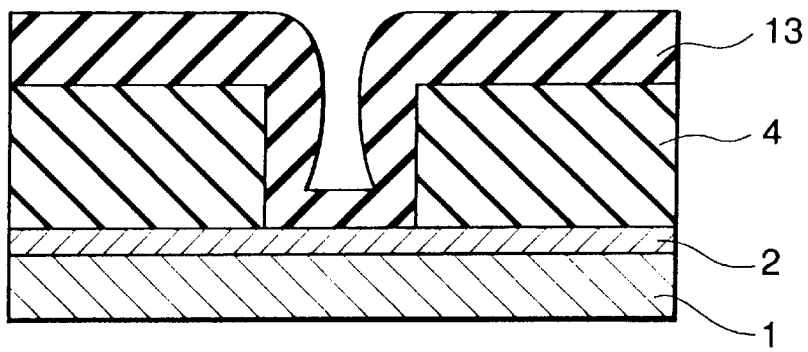
FIG. 7 is a cross sectional view for explaining a problem of a third conventional example.
Figure 8:
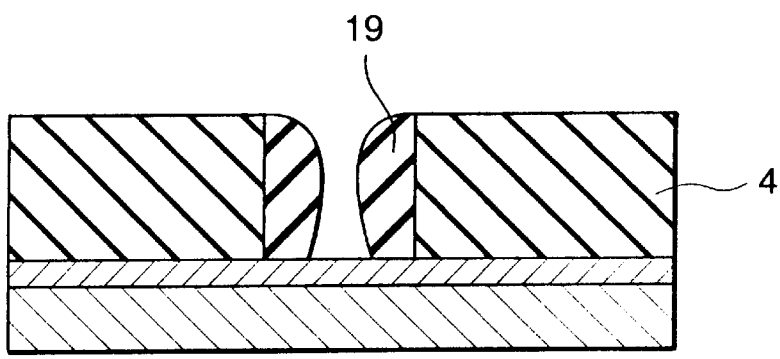
FIG. 8 is a cross sectional view for explaining a problem of a third conventional example.

However, it is assumed that an initial opening is narrow (0.4 $\mu$m) and deep (0.4 $\mu$m), as illustrated in FIG. 7. When an insulating film 13 for forming the sidewall is additionally grown, the insulating film 13 does not sufficiently reach a bottom portion because the upper portion becomes shadow. Consequently, the side surface becomes a reverse slope. When the insulating film 13 is etched back, a sidewall insulating film 19 is formed with the side surface of the reverse slope, as illustrated in FIG. 8.

Figure 9:
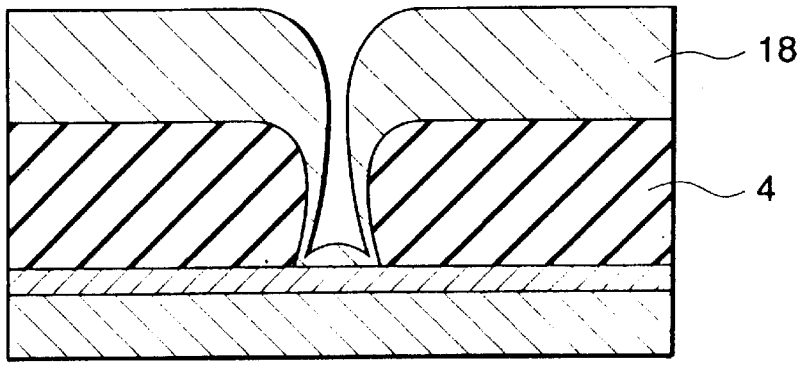
FIG. 9 is a cross sectional view for explaining a problem of a third conventional example.

In this event, the etching is carried out in the lateral direction in the bottom portion because the etching includes the isotropic other than the anisotropy. When an electrode metal 18 is vaporized under the opening shape, the vaporizing metal does not almost enter into the internal of the opening because the upper portion becomes shadow, as shown in FIG. 9. In consequence, the metal 18 of the side surface is thinned to increase the series resistance of the electrode.

As mentioned before, when the semiconductor layer (crystal surface of compound semiconductor) is exposed by the dry etching, the reacted product is formed by the crystal components and the carbon. Consequently, the excellent Schottky barrier can not be formed.

To avoid this, when the oxygen plasma is applied, the crystal is also oxidized, and is ground by melting in the subsequent oxygen process. In consequence, the threshold voltage $V_T$ becomes shallow so that the uniformity thereof is degraded.

Further, when the electrode is formed in the fine opening, it is difficult that the vaporized electrode metal sufficiently attaches on the side surface. In consequence, the electrode inevitably becomes thin. As a result, the series resistance is increased and the disconnection of the electrode often takes place.

Taking the above-mentioned problems into consideration, this invention provides a method of manufacturing a compound semiconductor device which is capable of equalizing threshold voltages $V_T$ of the FETs in the surface or between wafers and which is capable of suppressing an increase of series resistance of a fine electrode.

(Principle of this invention)

A principle of this invention will first be described for a better understanding of this invention.

When an opening is formed in an insulating film by the use of the dry-etching, such as, the ECR method using fluorine based gas by using a photo-resist film pattern as a mask, and thereby, a crystal surface of a compound semiconductor, such as, GaAs or InP, is exposed, the crystal surface is covered with a reacted product formed by compound semiconductor components and carbon, as mentioned before.

As a result of examination, it has been confirmed that the carbon is mainly supplied from the photo-resist film which is placed on the upper portion. More specifically, when the crystal surface is exposed, the semiconductor crystal which is activated by fluorine radical combines and reacts with the carbon other than the fluorine. This results in the reacted product on the exposed crystal surface. Further, the physical sputtering effect is weakened by lowering the ion sheath voltage in order to reduce the damage for the crystal surface. This is another factor that the reacted product is left.

Therefore, the crystal surface of the compound semiconductor is exposed after the photo-resist which supplies the carbon is removed in this invention. In this case, the crystal surface is exposed by etching back by the use of fluorine based gas containing no carbon, such as $SF_6$ or $NF_3$, on the condition that the insulating film is left in the bottom portion of the opening.

Specifically, elements, such as, S, N, and other than the carbon do not strongly react with the compound semiconductor and, as a result, can be removed by melting the crystal to several nm by the use of the dilution acid process.

It is possible that hydrochloric is a source liquid of 36% for the GaAs. However, soaking into the fine opening is improved by diluting with pure water. Further, it is desirable the source liquid of phosphoric acid is diluted to 10% or less because the source liquid has extremely high viscosity at 85%. Sulfuric acid is undesirable because it melts the GaAs.

On the other hand, it is preferable to use liquid which is diluted phosphoric acid or sulfuric acid to 10% or less for the InP because the hydrochloric melts the crystal. Further, it is possible to perform the diluted alkali process for total compound semiconductor. To this end, ammonium $NH_4OH$, ammonium fluoride $NH_4F$, ammonium sulfide $(NH_4)_2S$ can be used.

When gas which is added oxygen $O_2$ into gas containing the carbon, such as $CF_4$, is used as the etching gas, generation of the reacted product of the carbon is suppressed. However, the compound semiconductor surface is oxidized and ground by melting in the subsequent acid process. In consequence, this process is inadequate.

Further, the chlorine-based gas containing chlorine, such as $CCl_2F_2$ or $CCl_4$, is also undesirable to etch GaAs or InP of the compound semiconductor.

Moreover, the slope can be formed on the side surface of the insulating film opening in this invention. Specifically, the insulating film is etched to about half depth by the use of the RIE method having the strong anisotropy by using the photo-resist film as the mask. Thereafter, the insulating film is etched by withdrawing the photo-resist film in the lateral direction. Thereby, the insulating film of the withdrawn portion of the photo-resist is etched to form the slope on the side surface of the opening.

It is possible to add oxygen into fluorine based gas, to enhance the pressure by the use of the fluorine based gas, to use the chlorine based gas, and to use gas which adds the fluorine based gas into the chlorine based gas, as the method for withdrawing the photo-resist film in the lateral direction.

Although the slope takes place on the upper portion of the insulating film by withdrawing the photo-resist, the original groove formed by the RIE method is kept in shape of thereof due to the anisotropy of the etching, and as a result, is transcribed to the lower portion of the opening even when the photo-resist is removed.

In this event, the etching gas pressure can be kept in the first method for adding the oxygen. Consequently, the first method is most suitable because the anisotropy can be readily kept. On the other hand, the second method of enhancing the etching gas pressure is effective when the oxygen is not introduced.

As mentioned before, when the isotropic is increased in the etching, the side etching is carried out. The third chlorine based gas readily etches the photo-resist and easily becomes isotropic. To avoid this, it is effective that the fluorine base gas is mixed to weaken the effect of the chlorine.

It is possible to form the slope on the side surface at the upper portion of the opening in accordance with the method of withdrawing the photo-resist film in the course of the etching. Therefore, even when the opening becomes fine, the opening side surface can be covered with the electrode metal. As a result, the disconnection of the electrode metal or the increase of the resistance value can be prevented.

Subsequently, description will be made about embodiments of this invention with reference to the drawings.

(First embodiment)

Figure 10:
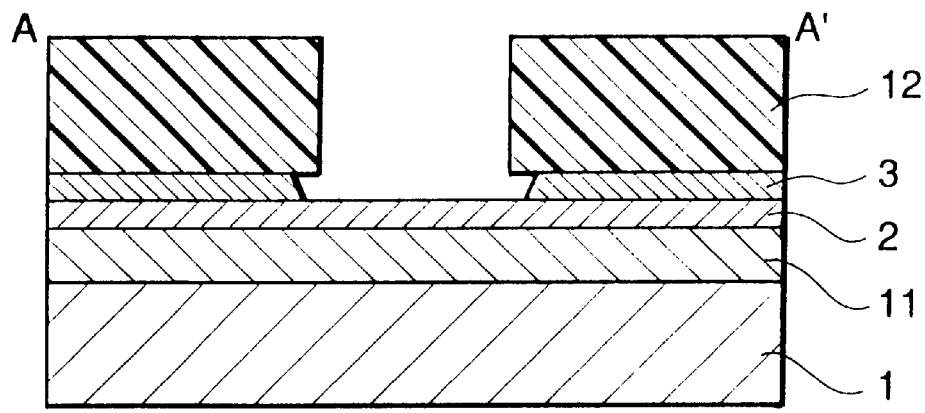
FIG. 10 is a cross sectional view showing a semiconductor compound device in an initial manufacturing step according to each of a first through seventh embodiment.
Figure 11:
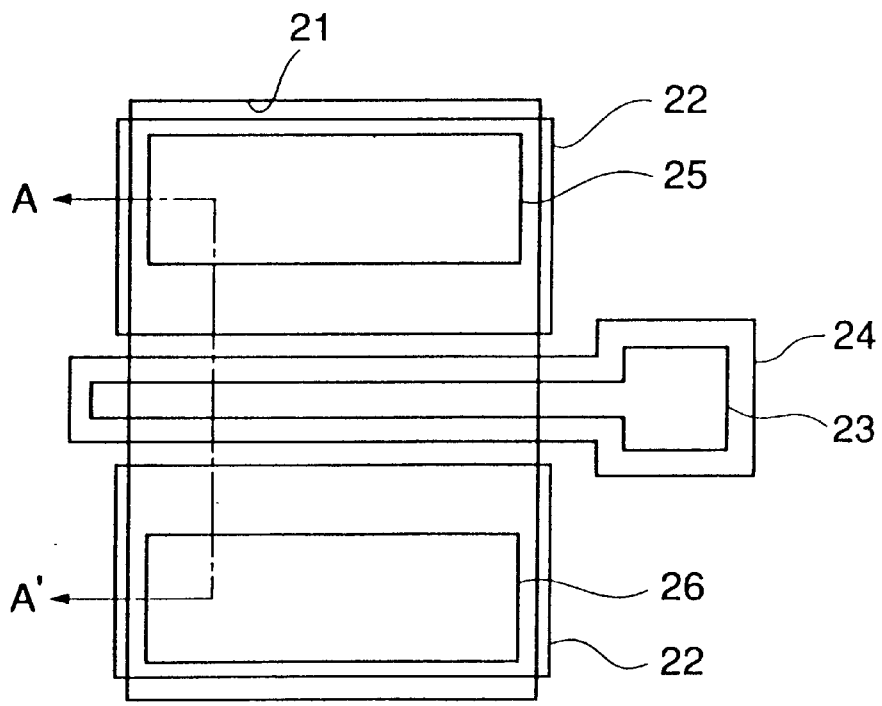
FIG. 11 is a layout diagram showing a compound semiconductor device, taken along A–A' line in FIG. 10.

Referring to FIGS. 10 through 12, a first embodiment will be described.

As illustrated in FIG. 10, a crystal layer is grown on a semiconductor substrate 1 which is formed by a semi-insulating i-type GaAs by the use of the MOCVD method or the MBE method. Specifically, a buffer layer 11 (an i-type GaAs) is deposited on the semiconductor substrate 1 to a thickness of 500 nm. Next, a channel layer 2 (an n-type $Al_{0.3}Ga_{0.7}As$ having carrier concentration of $2.0\times10^{18}$ cm$^{-8}$) is deposited on the buffer layer 11 to the thickness of 40 nm. Successively, a contact layer 3 (an n-type GaAs having carrier concentration of $4.0\times10^{18}$ cm$^{-3}$) is deposited on the channel layer 2 to the thickness of 100 nm. Thereinafter, the buffer layer 11 will be abbreviated in the drawings except FIG. 10.

In this case, the channel layer 2 is controlled as follows. Namely, the substrate in which the contact layer 3 is not grown on the condition that the channel layer is deposited is taken out of the growth apparatus. Thereafter, aluminum (Al) is immediately vaporized thereon to form a Schottky electrode by patterning to a preselected shape. Next, an ohmic electrode which is alloyed with an indium (In) is formed adjacent to the electrode.

Under this circumstance, the distribution characteristic of the carrier concentration is determined from the relationship (namely, C-V characteristic) between applied voltage and static capacitance to confirm the concentration of the doped carrier. In the control specification of the channel layer in the C-V characteristic, the doped carrier concentration and the accuracy are $2.0\times10^{18}$ cm $^{-3}$ and $\pm10\%$ under the applied voltage of 0V while the pinch-off voltage corresponding to the carrier concentration $1\times10^{16}$ cm$^{-3}$ is $-1.3\pm0.20$V.

In this event, after the FET is fabricated, the control is carried out so that the accuracy of the threshold voltage $V_T$ is within the range of +0.15V However, a simple measuring method of the static capacitance is used in the above control method. Consequently, the accuracy is lowered. In this case, $2\sigma$ is used as the $\pm$ value of each accuracy. Herein, it is to be noted that the $\sigma$ represents the standard deviation.

Further, with respect to the growth thickness, the buffer layer 11 is formed by repetition laminate layers of the i-type GaAs and the i-type AlGaAs, and the average repetition film thickness can be detected by the use of the measurement of X-ray. For example, each layer is grown with ten periods of 20 nm by the MOCVD of the rotation revolution type, and the film thickness accuracy of one period (40 nm) can be set to $\pm2$ nm.

Subsequently, a semiconductor device is fabricated by the use of the photolithography technique for the epitaxial growth semiconductor substrate.

As illustrated in FIG. 11, a photo-resist which covers a reverse pattern of a device separation region 21 is formed. In this condition, the device separation is carried out by the use of the ion implantation. Specifically, $^{11}B^+$ ions are doped under the acceleration energy of 200 keV and doping dose of $1\times10^{13}$ cm$^{-2}$. Thereby, defect causes to be occur in the device separation region to enhance the resistance.

Subsequently, a photo-resist film which coves a contact region 22 is formed, and a contact layer is processed, as shown in FIG. 10. Next, an insulating film is formed so as to cover the entire surface. Further, a photo-resist of an opening pattern of a gate opening 23 is placed to form the gate opening 23 by etching the insulating film.

Subsequently, an electrode metal is deposited to process to a pattern of a gate electrode 24. Thereafter, a photo-resist film which has an opening in a pattern of ohmic electrodes 25 and 26 is formed to open the insulating film. Further, the ohmic metal is lifted off by the use of the photo-resist to form a source electrode 25 and a drain electrode 26. Thus, the formation step of the FET is completed. In this case, the gate opening 23 is placed near the source side.

Subsequently, description will be made about steps after the epitaxial growth substrate is completed with reference to FIGS. 12A through 12D together with FIGS. 10 and 11.

As illustrated in FIG. 10, a photo-resist 12 which corresponds to the contact region 22 in FIG. 11 is formed to etch the contact layer 3 by the dry etching. The etching is carried out by the ECR apparatus by using gas which mixes $BCl_3$ of 15 sccm with $SF_6$ of 5 sccm (25%) under the pressure of 1 mTorr. When the channel layer 2 is exposed, the etching is halted because aluminum fluoride $AlF_X$ covers the surface. Herein, it is to be noted that etching selection rate between GaAs and AlGaAs is 100 times or more.

Subsequently, the photo-resist 12 is removed by the use of the organic solvent. In this event, fluoride layer is removed by immersing in the dilution hydrochloric for several minutes. Further, supersonic wave is applied in the organic washing. In this event, the washing is carried out in order of several times of methyl ethyl ketone and isopropanol and, thereafter is dried. Herein, the dilution hydrochloric is a liquid of 20° C. which mixes concentrated hydrochloric acid of 36% with pure water at a rate of 1:1.

Although the photo-resist 12 is used as the mask in the etching condition of the GaAs, the reacted product of the carbon causes no problem. This is because the etching rate between the GaAs and the photo-resist is high at 50 times and as a result, the etching quantity of the photo-resist is small. Further, the etching rate of the GaAs is rapid. Thereby, the etching power is small. Moreover, the photo-resist can be readily removed by the use of the organic solvent without hardening.

Figure 12A:
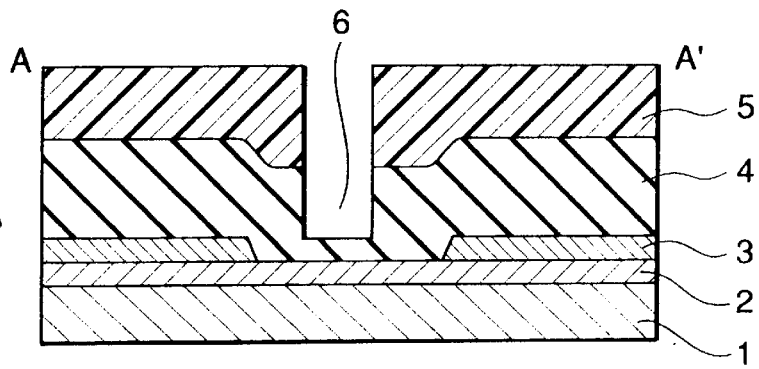
FIGS. 12A through 12D are cross sectional views showing a method of manufacturing a compound semiconductor device according to a first embodiment.

Subsequently, as shown in FIG. 12A, an insulating film 4 (namely, a silicon oxide film $SiO_2$) is deposited to a thickness of 700 nm. Thereafter, a photo-resist film 5 which is corresponds to the gate opening 23 illustrated in FIG. 11 is formed on the insulating film 4. In this event, the photo-resist film 5 has the thickness of about 1 $\mu$m and the opening lateral width of 1.0 $\mu$m.

Although not shown in FIG. 12A, a reflection prevention film is inserted below the photo-resist film 5 to improve exposure accuracy of the stepper. Herein, it is to be noted that a WSi film may be used as the reflection prevention film.

Next, the insulating film 4 is etched by the use of the parallel plate type RIE apparatus so that the film thickness of the insulating film 4 becomes about 100 nm. Thus, a gate opening 6 is formed in the insulating film 4 on the condition that a part of the insulating film 4 is left at the bottom portion, as illustrated in FIG. 12A. Herein, the etching is carried out by using a mixed gas of $CF_4$ with $H_2$ having flow rate of 20% under the gas pressure of 80 mTorr and the ion sheath voltage of 70V.

Figure 12B:
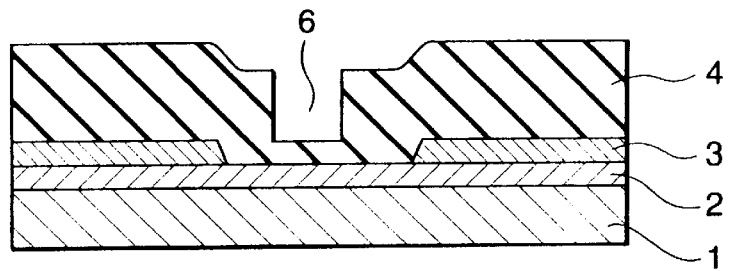
Figure 12C:
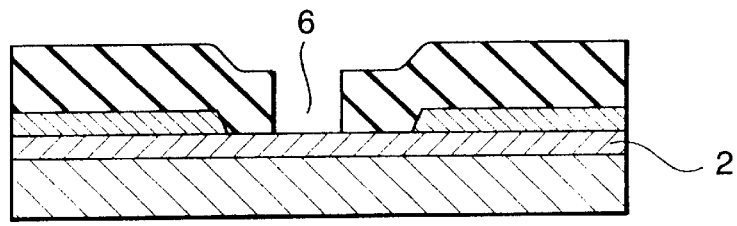

Subsequently, the photo-resist film 5 is removed by the use of the oxygen plasma, as shown in FIG. 12B. Successively, the organic washing is carried out. Thereafter, the remaining insulating film 4 is etched to 150 nm by the ECR dry etching so that the gate opening 6 penetrates to the channel layer 2. In this event, the etching is carried out by using $SF_6$ gas under the pressure of 1 mTorr and the ion sheath voltage of 2V or less at the $SiO_2$ etching rate of 36 nm/min.

Thereafter, the organic washing and the dilution acid process are carried out, and a $WSi_X$ is vaporized to the thickness of 200 nm by the sputtering process to form a schottky metal 10. In this case, the affect due to electrons and ions near the target can be suppressed by separating the semiconductor substrate from the sputter target with a preselected distance, for example, 15 cm or more. Next, the heat treatment is carried out at the temperature of 400° C. for 30 minutes in the hydrogen atmosphere to recover a small damage. Successively, Ti having the film thickness of 30 nm and Au of the film thickness of 600 nm are vaporized by the sputtering to reduce the resistance.

Figure 12D:
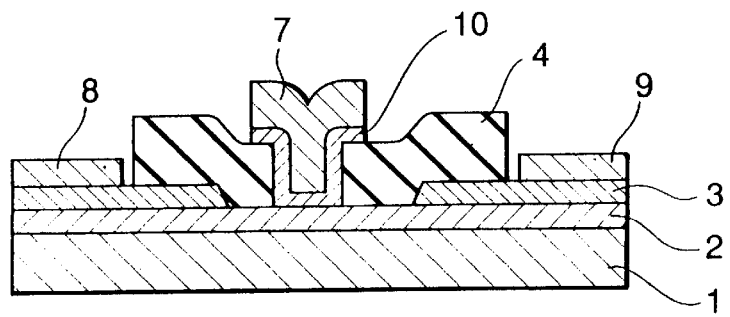

Subsequently, a gate electrode 7 is formed by processing by the ion milling by the use of the pattern of the gate electrode 24 illustrated in FIG. 11, as shown FIG. 12D. Further, the insulating film 4 is opened by the buffered hydrofluoric acid by the use of the patterns of the ohmic electrodes 25 and 26 illustrated in FIG. 11. Next, AuGeNi which is the ohmic metal is vaporized and the lift off is carried out. Thereafter, a source electrode 8 and a drain electrode 9 are formed by alloying with the heat treatment, as illustrated in FIG. 12D.

In this case, about 80 of wafers which has a diameter of 76 mm (3 inch) were attempted. The threshold voltage of the obtained FET was $-0.92\pm0.15$V ($2\sigma$) between batches due to the MOCVD growth and the internal of the wafer, and the maximum transconductance gm was 360 mS /mm at the average. Further, the standard deviation $\sigma$ of $V_T$ inside the wafer surface was within the range between 30 and 50 mV.

Moreover, the grinding of the channel layer 2 was about 3 nm in the etching of the contact layer 3, and 3 nm in the opening formation of the insulating film 4 in accordance with the Transmission Electron Microscopy (TEM) observation after the device formation. Namely, the channel layer 2 is ground with 6 nm for the initial thickness 40 nm so that the thickness of 34 nm was left.

In this event, $V_T$ of about 100 mV is changed for the change of the channel thickness of 1 nm in $V_T$ near this film thickness. Consequently, it is assumed that the total accuracy of the thickness is $\pm1.5$ nm from the above measurement result.

As the comparison experiment, as the thickness of the remaining insulating film ($SiO_2$) due to the initial RIE is thinned from 100 nm, when the film thickness becomes 50 nm or less, $V_T$ is shallow by changing in the positive side. In consequence, the uniformity in the wafer surface is lowered. On the other hand, when the opening is formed on the condition that no $SiO_2$ film is left, the channel layer is damaged. Consequently, the carriers are eliminated so that the channel becomes non-conductive. Under this circumstances, the damage was not recovered by the use of the heat treatment of 400° C.

Therefore, although it is necessary that the thickness of the $SiO_2$ remaining film is 50 nm or more at which the damage starts to appear, the film thickness is set twice (to 100 nm), taking the etching accuracy of the RIE into consideration in this example.

As a second comparison experiment, the thickness of the $SiO_2$ remaining film in the RIE was set to 100 nm. In this condition, the remaining film was etched by the use of the ECR method on the condition that the photo-resist film was left. The etching quantity of the $SiO_2$ film was changed within the range between 150 and 300 nm. After the photo-resist film was removed by the use of the organic washing, the dilution acid process was carried out to form each electrode like the first embodiment.

In consequence, it was difficult that the current flowed (namely, almost non-conductive state). As a result, the voltage current characteristic was uneven in the forward direction in the wafer surface. Further, the gate did not normally function in the characteristic between the gate voltage and the drain current. Consequently, the drain current was not almost variable in many cases. This was because the reacted product was left on the interface of the gate electrode independently of the etching quantity of the $SiO_2$ film.

Moreover, as a third comparison experiment, after the etching due to the ECR, the ashing process due to the oxygen plasma was carried out to remove the photo-resist film in the organic washing. Thereafter, the dilution acid process was performed to form each electrode. In this case, although the gate conductive characteristic in the forward bias was improved by the use of the plasma process for 10 minutes, non-conductive samples remained.

Under this circumstance, when the plasma process was carried out for 30 minutes, the gate became conductive, and the gate characteristic became uniform. However, the threshold voltage $V_T$ was shallow at $-0.6\pm0.2$V ,and the a value in the wafer surface became large in the range between 40 mV and 80 mV. This is because the internal surface is unevenly oxidized by the oxygen plasma process, and as a result, the surface was ground by melting by the acid process.

As a fourth comparison experiment, affect of the over-etching of the $SiO_2$ film due to the ECR method was examined in this embodiment.

The etching rate in the opening having the lateral width of 1.0 $\mu$m was small at about 5% as compared to 36 nm/min in the flat plane. Further, the $SiO_2$ etching quantity in the flat plane is changed to 150, 200, 250, and 300 nm for the $SiO_2$ film which is left in the opening. When five wafers were manufactured as an experiment, respectively, the average $V_T/\sigma$ value became $-936/42$ mV, $-928/39$ mV, $-851/47$ mV, and $-683/62$ mV. It was assumed that $V_T$ became shallow and uneven due to both effects of the damage against the channel crystal layer and the subsequent crystal grinding by the acid process. Even when the ECR method with the low damage was used, if the over-etching was large, an adverse affect brought about. In consequence, it is desirable that the over etching is as small as possible.

(Second embodiment)

As a fifth comparison experiment, the final etching of the insulating film 4 was carried out by the use of the parallel plate type RIE instead of the ECR method. In this event, the etching was carried out by using $SF_6$ gas under high gas pressure of 150 mTorr. Further, high frequency power was put into the minimum level at whcih the plasma is generated, and the ion-sheath voltage was reduced to 20 V. Herein, the etching rate of the $SiO_2$ film was 4 nm/min.

In this circumstance, the etching quantity of the $SiO_2$ was changed to 150, 200, and 250 nm. When five wafers were manufactured as an experiment, respectively, the average $V_T/\sigma$ value became $-927/46$ mV, $-784/65$ mV, and $-259/143$ mV. As compared to the ECR method, $V_T$ largely became shallow and the uniformity was degraded for the over-etching quantity of the $SiO_2$ film. This is because the ECR method is lower in the damage than the RIE method. However, if the over etching becomes small by reducing the ion sheath voltage, it is possible to utilize the RIE method although the margin is small.

(Third embodiment)

In the third embodiment, the gate opening becomes narrow by the sidewall insulating film and at the same time, the slope is placed on the upper portion of the opening, like the third conventional example.

Referring to FIGS. 13A through 13D, description will be made about the third embodiment.

Figure 13A:
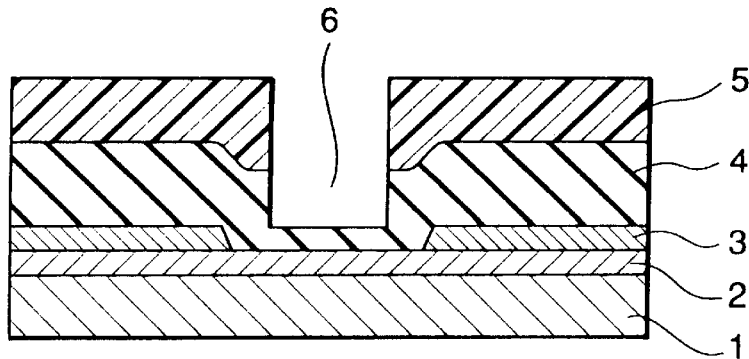
FIGS. 13A through 13D are cross sectional views showing a method of manufacturing a compound semiconductor device according to a third embodiment.

As illustrated in FIG. 13A, a silicon oxide film is deposited to a thickness of 700 nm as an insulating film 4. Thereafter, a photo-resist film 5 which has an opening of a lateral width of 1.0 $\mu$m is formed thereon. Next, the insulating film 4 is etched by the use of the parallel plate type RIE apparatus so that the thickness of the remaining film becomes about 100 nm. Consequently, a gate opening 6 is formed on the condition that the insulating film 4 is partially left on the bottom portion.

Figure 13B:
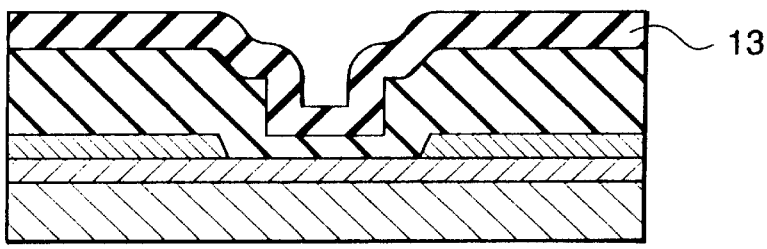

Subsequently, the photo-resist film 5 is removed, and an insulating film 13 for forming a side wall film ($SiO_2$) is deposited to the thickness of 300 nm, as illustrated in FIG. 13B.

Figure 13C:
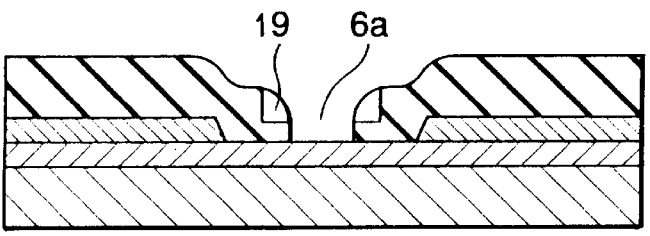

Next, the insulating film 4 is entirely etched by the use of the RIE so that the thickness of about 100 nm is left. Thereby, sidewall insulating films 19 are formed on side surface of the insulating film 4, as shown in FIG. 13C.

Successively, the insulating film 4 is etched to 200 nm by the use of the ECR dry etching so that a gate opening 6a penetrates to the channel layer 2. In this event, the gate opening 6a becomes narrow by the sidewall insulating film 19. The lateral dimension of this gate opening corresponds to the gate length at the bottom portion. Herein, the gate length is 0.6 μm.

If the side wall insulating film which has the thickness equal to the thickness of the flat plane is merely formed, the gate length becomes 0.4 μm. However, this difference is caused by the fact that the thickness of the side surface is thinner than that of the flat plane, and the etching is also carried out in the lateral direction in the ECR method.

Figure 13D:
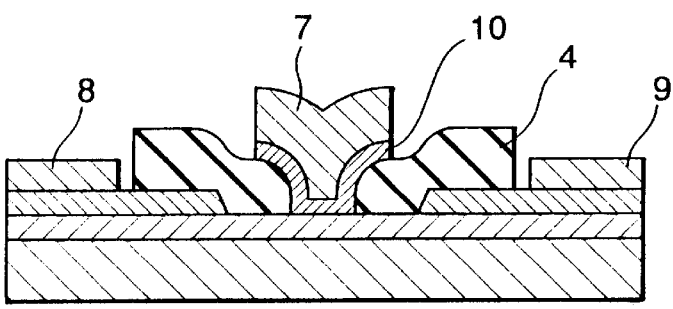

Subsequently, each electrode is formed like the first embodiment, as illustrated in FIG. 13D. Thus, the FET is completed.

In this embodiment, the gate opening is reduced by the use of the side wall insulating film, and at the same time, the curve face on the upper portion of the gate opening formed by the side wall insulating is formed to improve embedding of the gate metal. The threshold voltage $V_T$ of the obtained FET was −0.98±0.15V (2σ) between batches due to the MOCVD growth and the internal of the wafer, and the maximum transconductance gm was 420 mS/mm at the average. Further, the standard deviation σ of $V_T$ inside the wafer surface was within the range between 30 mV and 50 mV. As compared to the first embodiment, $V_T$ becomes deep and at the same time, gm is improved due to the short channel effect that the gate length is shortened from 1.0 μm to 0.6 μm.

(Fourth embodiment)

Subsequently, description will be made about a method of improving connection of a fine electrode without the sidewall insulating film with reference to FIGS. 14A through 14D.

Figure 14A:
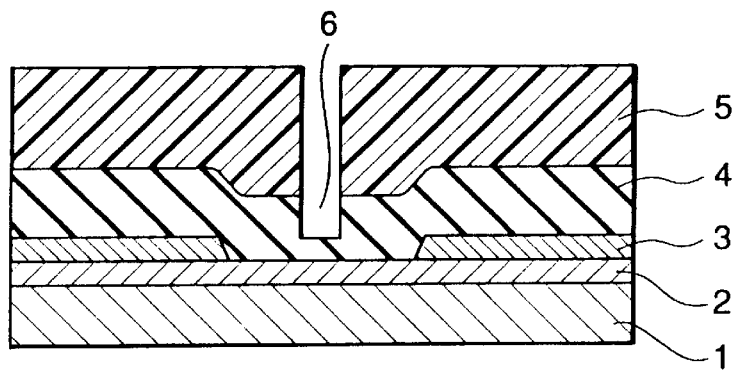
FIGS. 14A through 14D are cross sectional views showing a method of manufacturing a compound semiconductor device according to a fourth embodiment.
Figure 14B:
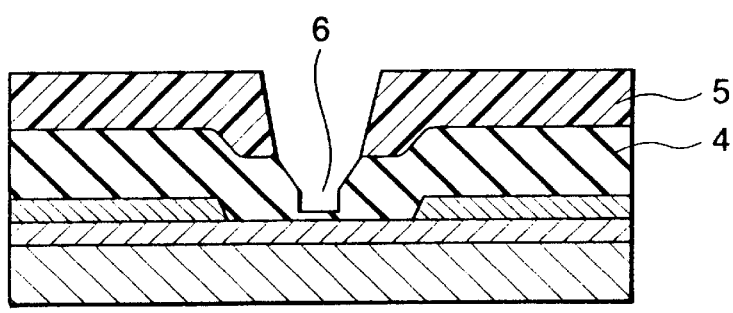

As illustrated in FIG. 14A, after a silicon oxide film having a thickness of 700 nm is deposited as an insulating film 4, a photo-resist 5 which has a short opening having an opening width of 0.4 μm and the thickness of 1 μm is formed thereon. In this event, a reflection prevention film (not shown) is inserted below the photo-resist film 5 to improve exposure accuracy of the stepper. Next, the etching is carried out by the use of the RIE to form a gate opening 6 using the photo-resist film 5 as a mask so that the insulating film 4 is left at half depth (about 300 nm). Herein, the etching is performed using $CF_4$ and $H_2$ of flow rate 20% under the gas pressure of 80 mTorr.

Subsequently, another etching is additionally carried out by the ECR dry etching to thin the insulating film 4 in the gate opening 6 to the thickness of about 50 nm. In this case, this etching is carried out using gas which is mixed $CF_4$ of 14 sccm with oxygen $O_2$ of 6 sccm (30%) under the gas pressure of 1 mTorr.

Under this circumstance, the opening of the photo-resist film 5 is enlarged in the lateral direction by the etching, and at the same time, a slope is formed on the upper portion of the gate opening 6. However, the opening shape formed by the initial RIE is transcribed on the bottom portion of the opening by the etch-back even when the photo-resist film is removed.

In this event, the ECR dry etching has weak anisotropy under the low damage condition, as mentioned before. Thereby, the lateral dimension of the bottom portion is enlarged to 0.5 μm. Further, the lateral dimension of the upper portion of the gate opening 6 having the slope is about 1.2 μm.

Figure 14C:
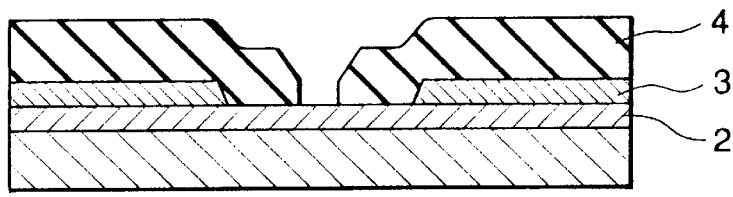

Thereafter, the photo-resist film 5 is removed by the use of the ashing process due to the oxygen plasma, as shown in FIG. 14C. After, the organic washing is performed, the insulating film 4 is etched to 100 nm by the ECR dry-etching using $SF_6$ gas. Consequently, the surface of the channel layer 2 is exposed in the gate opening 6.

Figure 14D:
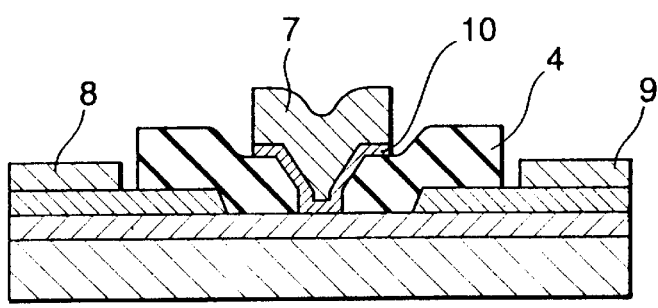

Subsequently, each electrode is formed like the first embodiment, as illustrated in FIG. 14D. Thus, the manufacturing step of the FET is completed.

The slope takes place on the upper portion of the gate opening 6 by withdrawing the photo-resist film 4. Thereby, the embedding of the metal is improved. Moreover, the insulating film 4 can be thinned immediately before the crystal surface is exposed because the etching is conducted by the ECR method having the low damage in comparison with the RIE method. Rather than, the thickness of the remaining film can be determined so that the crystal surface is not exposed from the uniformity of the deposited film and the etching uniformity of the RIE method and ECR method.

In the above embodiment, the deposited film is thin at the periphery of the wafer, and the etching rate is rapid. Therefore, the thickness of the remaining film is set to 50 nm at the center portion. Consequently, the etch-back quantity can be reduced after the photo-resist film is removed. Further, the etching rate is not almost lowered in the bottom portion because the upper portion of the opening is enlarged by the slope.

The threshold voltage $V_T$ of the obtained FET was −1.03±0.15V (2σ) between batches due to the MOCVD growth and the internal of the wafer, and the maximum transconductance gm was 440 mS/mm at the average. Further, the standard deviation σ of $V_T$ inside the wafer surface was within the range between 30 and 60 mV. As compared to the first through third embodiments, although $V_T$ became deep due to the short channel effect, the uniformity and the reproducibility were equal to the other embodiments.

(Fifth embodiment)

Description will be made about the case that the withdraw etching in the lateral direction is carried out by the use of the RIE method instead of the ECR method. Herein, the etching gas pressure is enhanced in the above RIE method.

The etching was performed by using $CF_4$ gas under high gas pressure of 150 mTorr on the condition that the ion sheath voltage was lowered to 40 V. In this case, the etching rate of the $SiO_2$ film was 18 nm/min. In this condition, the etching was conducted so that the insulating film is left to 100 nm on the bottom portion of the gate opening. In this event, the dimension of the bottom portion in the lateral direction was enlarged to about 0.6 μm. Further, the opening dimension of the upper portion of the opening was about 1.2 μm and the slope was formed on the upper portion of the opening.

(Sixth embodiment)

The other gases which is capable of etching the insulating film ($SiO_2$) may be utilized as the gas for withdrawing the photoresist film in the lateral direction because the etching is not performed so as to expose the semiconductor crystal. For instance, $SF_6$ or $NF_3$ are usable in the fluorine base, and oxygen may be added. Further, chlorine based gas may be usable because the etching ratio of the insulating film is similar to the etching rate of the photo-resist or less so that the isotropic etching is readily performed.

However, it was difficult to control the etching of the photo-resist when the ratio of the chlorine is high. Therefore, it was possible to adjust the shape by mixing the fluorine-based gas. For example, $BCl_3$ and $CF_4$ were mixed at the rate of 1:2.

(Seventh embodiment)

Referring to FIGS. 15A through 15D, description will be made about a seventh embodiment. In the seventh embodiment, the connection for the fine electrode is improved by withdrawing the photo-resist opening in the lateral direction and the sidewall insulating film.

Figure 15A:
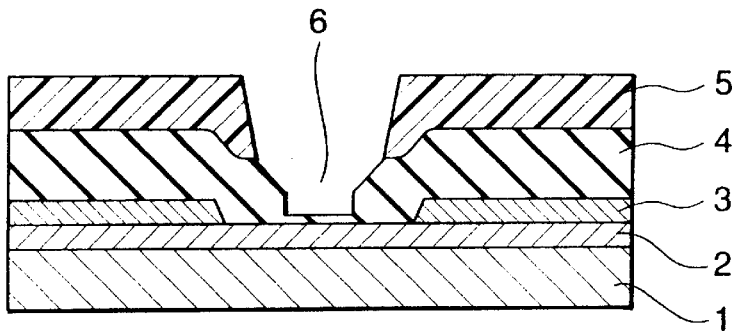
FIGS. 15A through 15D are cross sectional views showing a method of manufacturing a compound semiconductor device according to a seventh embodiment.

As illustrated in FIG. 15A, a silicon oxide film is deposited to a thickness of 700 nm as an insulating film 4, as illustrated in FIG. 15A. Thereafter, a photo-resist film 5 which has an opening having a opening width of 0.4 $\mu$m and the film thickness of about 1 $\mu$m is formed thereon. In this event, a reflection prevention film is inserted below the photo-resist film 5 to improve exposure accuracy of the stepper. Thereafter, the insulating film 4 is etched by the RIE method so that the insulating film 4 is left to half (300 nm).

Subsequently, the ECR dry etching is carried out for the insulating film 4. Thereby, the insulating film 4 is thinned to about 50 nm on the bottom portion of the opening, and at the same time, the slope takes place on the upper opening portion of the insulating film 4. Herein, it is to be noted that the ECR etching is performed by using a mixed gas containing $CF_4$ and oxygen $O_2$ of 30% as the etching gas. In this condition, the lateral dimension of the formed gate opening is widened to 0.5 $\mu$m.

Figure 15B:
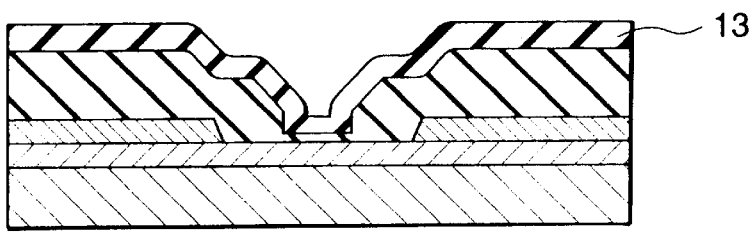

Subsequently, the photo-resist 5 is removed by the use of the oxygen plasma process, as shown in FIG. 15B. After the organic washing process is carried out, a $SiO_2$ is deposited to the thickness of 300 nm as an insulating film 13 for forming a sidewall film. In such deposition, the dimension of the lateral direction of the bottom portion of the opening becomes 0.1 $\mu$m. In this event, the thickness of the insulating film on the bottom portion of the opening becomes thinner than that of the flat surface portion.

Figure 15C:
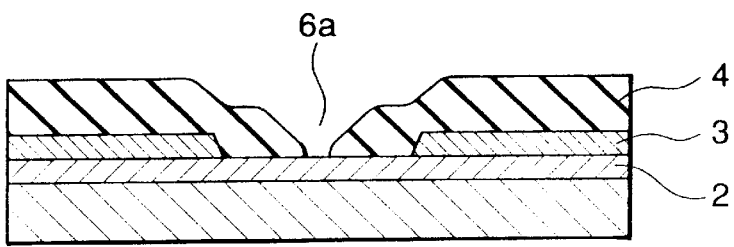

Next, the $SiO_2$ film is etched to 100 nm on the bottom portion of the opening by the RIE method in which $CF_4$ gas and $H_2$ gas are used, as illustrated in FIG. 15C. In this event, the insulating film is etched to 20 nm in the flat portion while the etching rate is lowered in the opening because the opening is fine.

Successively, the insulating film 4 is etched to 200 nm at the flat surface portion using $SF_6$ by the use of the ECR dry etching. Thereby, a channel layer 2 is exposed in the gate opening 6a, as illustrated in FIG. 15C. In this case, the dimension in the lateral direction as the gate length is 0.2 $\mu$m on the bottom portion of the opening.

Figure 15D:
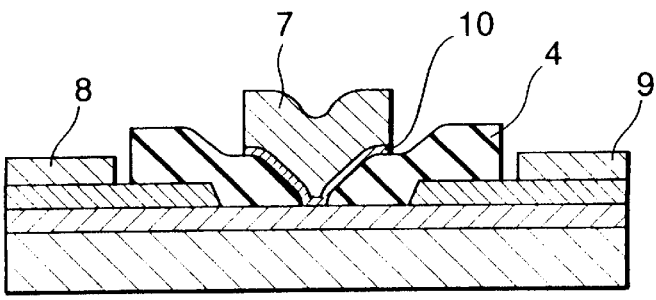

Subsequently, each electrode is formed like the first embodiment, as illustrated in FIG. 15D. Thus, the manufacturing step of the FET is completed. The withdraw in the lateral direction of the photo-resist and the slope by the sidewall insulating film are formed on the upper portion of the gate opening 6a. In consequence, the embedding of the gate metal is improved.

The threshold voltage $V_T$ of the obtained FET was $-1.20\pm0.20V$ ($2\sigma$) between batches due to the MOCVD growth and the internal of the wafer, and the maximum transconductance gm was 480 mS/mm at the average. Further, the standard deviation $\sigma$ of $V_T$ inside the wafer surface was within the range between 50 and 90 mV. As compared to the other embodiments, the gate length became short to 0.25 $\mu$m. Thereby, $V_T$ becomes deep due to the short channel effect. Consequently, the uniformity and the reproducibility were slightly degraded in comparison with the other embodiments.

(Eighth embodiment)

So far, description has been made about one stage recess gate structure in which the gate is placed on the flat bottom surface of the recess which is embedded in the semiconductor layer. This structure is characterized in that the drain withstands pressure and the gate reverse break-down voltage of the FET can be enhanced. This invention is not limited to the one stage recess structure, and is effective for a double stage embedding gate structure in which the semiconductor layer is further embedded from the insulating film before the gate electrode is formed. For instance, this manufacturing method is disclosed in Japanese Unexamined Patent Publication No. Hei. 2-105540.

The double stage recess embedding structure is characterized in that the effect due to the surface depletion layer which extends from the surface of the semiconductor layer can be removed by embedding the gate in the semiconductor layer.

In the single stage recess gate structure, the surface depletion layer which extends to the gate side serves to enhance pressure withstanding. The electric charge state of the surface level on the semiconductor surface with respect to the surface depletion layer is variable in accordance with the operation state of the FET. In consequence, the waveform becomes dull in the sharp pulse amplification while the analog amplification factor fluctuates in the low frequency side. In this event, in the single stage recess structure, if the bandwidth of the high frequency is limited and the bias state of the circuit is invariable, no problem occurs.

In the double stage recess embedding gate structure, the gate depletion layer is deeper than the surface depletion layer by embedding the gate in the semiconductor layer. Thereby, the amplification factor as the controllability of the channel current is enhanced, and the response and the frequency dependency in the pulse amplification is improved. Consequently, the wide bandwidth can be achieved. Reversibly, the break-down voltage of the drain is lowered, and the cut-off frequency as the high frequency characteristic is reduced due to the increase of the gate capacitance. Therefore, it is important to adjust each FET function characteristic by the depth of the second recess and the structure factor in accordance of requirement performance of the FET. In this invention, it is possible to form the second recess at the high accuracy because the contamination and the crystal grinding is small before the second recess is formed.

Figure 16A:
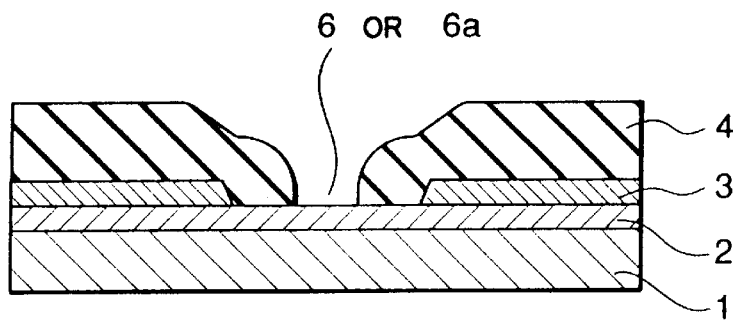
FIGS. 16A through 16C are cross sectional views showing a method of manufacturing a compound semiconductor device according to an eighth embodiment.
Figure 16B:
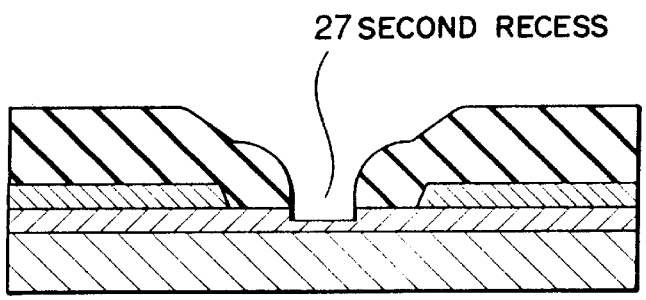
Figure 16C:
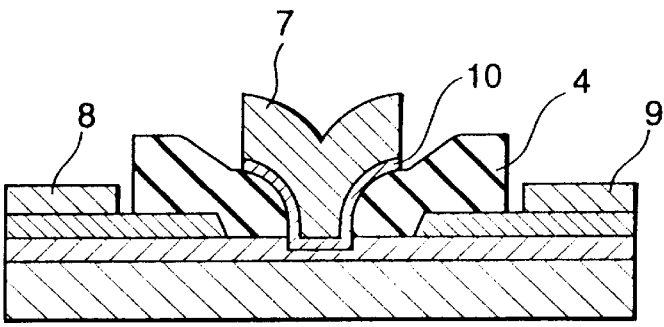

Referring to FIGS. 16A through 16c, description will be made about the eighth embodiment of this invention. In this embodiment, the thickness of the channel layer 2 (n-type $Al_{0.3}Ga_{0.7}As$) is set to 50 nm instead of 40 nm, and becomes thick at 10 nm corresponding to the depth of the second recess.

As illustrated in FIG. 16A, a $SiO_2$ film 4 is etched back on the condition that no photo-resist is formed. An n-type AlGaAs channel layer 2 which is exposed from a gate opening 6 or 6a is washed by the use of the organic washing process and the dilution hydrochloric process, In this event, the gate length of the $SiO_2$ film opening is set to 0.4 μm.

Subsequently, a second recess 27 is formed by digging the n-type AlGaAs channel layer 2 to the thickness of 100 nm by the wet etching process, as illustrated in FIG. 16B.

Herein, it is to be noted that the wet etching is classified into two methods. In a first method, A liquid for crystal oxidation and B liquid for oxide layer removal are repeated. In this event, the A liquid has the temperature of 20° C. with the dilution which is specified by excess oxide hydrogen water (31 wt %):water=1:50. On the other hand, the B liquid has the temperature of 20° C. with the dilution which is specified by chorine (36 wt %):water=1:5. In this case, the liquid vessel has the room temperature to enhance the control.

The wafer which is placed on a Teflon case is moistened with water washing for one minute. Thereafter, the wafer is immersed in the A liquid for one minute to oxide the crystal surface with the excess oxide hydrogen water, and the crystal oxide layer is removed with the dilution hydrochloric acid by immersing it in the B liquid after shower water washing for two minutes. In this event, in a sequence of a step of the shower water washing, the crystal of 2.3 nm was ground, and the crystal of about 10 nm was ground by repeating this step at four timed.

The etching rate was actually conducted by repeating this step at ten times and observing the cross sectional of the sample with the scanning electron microscope (SEM). In this event, the average value was obtained by dividing the measured digging depth by the repeating number.

In the second method, the wet etching was performed by rotating the wafer. The liquid was prepared by the rate specified by phosphoric acid (85 wt %):the access oxide hydrogen water(31 wt %):water=4:1:200 and has the temperature of 20° C.

The wafer was placed in parallel by fixing the rear surface of the wafer by the vacuum chuck. After the wafer was moistened by splashing the pure water to the wafer, the wafer was rotated at low speed of 20 rpm, and at the same time, the pure water was splashed to the central portion of the wafer. Next, the pure water was halted, and the same time, the etching liquid was splashed into the central portion of the wafer to etch for 23 seconds.

Subsequently, at the same time that the etching liquid was halted, the pure water was splashed and was washed with water for 60 seconds. Thereafter, the pure water was halted, the rotation number of the wafer was raised up to 200 rpm and was centrifugal dried for 30 seconds.

The etching quantity can be accurately controlled by using such a fresh etching liquid and momentarily changing the liquid. In this event, the etching rate was actually measured by changing the etching time, observing the cross sectional of the sample with the scanning electron microscope (SEM) and measuring the digging depth. Herein, it is to be noted that the etching rate is 26 nm/min.

As illustrated in FIG. 16C, WSi is vaporized by the sputtering to form the schottky metal 10 and the respective electrodes by the use of the dilution hydrochloric process like the above-mentioned embodiments. In this case, the gate electrode 7 is embedded in the second recess 27, as shown in FIG. 16C. The second recess is shallow and has a small side etching. Thereby, the metal is embedded in the second recess by the vaporizing due to the sputtering. When the second recess becomes deep, the side etching inevitably takes place. Consequently, the metal is cut out in the step shape like the second conventional example illustrated in FIG. 5. Therefore, it is desirable the depth of the second recess is 50 nm or less from experience.

In this condition, 30 of wafers each of which had the diameter of 76 mm was manufactured as an experiment for each of the second recess methods. In this event, the first method of repeating the two liquids was carried out at every five wafers with the preselected interval. In consequence, the threshold voltage $V_T$ of the obtained FET was −1.96±0.18V (2σ), and the a value was within the range between 30 and 60 mV in the wafer plane.

On the other hand, the second method of rotating the wafer was performed at every ten wafers with the preselected interval. In consequence, the threshold voltage $V_T$ of the obtained FET was −0.98±0.21V (2σ), and the a value was within the range between 40 mV and 80 mV in the wafer plane. Thus, the second method had a trend that $V_T$ was shallow in the central portion of the wafer.

In the first method, the internal plane a value was within the range between 30 mV and 50 mV in the embodiment having the second recess. Further, the rate determining of the wet oxide was utilized. Consequently, the uniformity in the plane of the MOCVD epitaxial substrate was kept, and the wafer internal plane was uniformly etched.

In the second method, the etching quantity trends to be large because the etching liquid is splashed into the central portion of the wafer. However, the reduction of the etching due to contamination on the crystal surface and the crystal grinding due to the oxide plasma process was suppressed. Consequently, the threshold voltage $V_T$ was not extremely increased in comparison with ±0.15V (2σ) of $V_T$ distribution in the first, third and fourth embodiments. As a result, it is confirmed that the wet etching is almost uniformly carried out, and the second recess is formed with an excellent reproducibility.

(Ninth embodiment)

In this embodiment, this invention is applied for forming the opening in the third conventional example disclosed in Japanese Unexamined Patent Publication No. Sho. 63-174374. In this example, the recess is formed by side-etching the crystal from the opening of the insulating film. Further, after the sidewall insulating film is formed inside the recess, the gate electrode which is separated in the self-aliment manner from the crystal side surface by the sidewall insulating film is formed. In this condition, this invention is applied to the step of forming the opening of the initial insulating film.

Referring to FIGS. 17A through 17F, description will be made about the ninth embodiment. Herein, the used epitaxial substrate is the same as that in the first embodiment. However, the contact crystal layer is not processed by using the photolithography described in the first embodiment. On the other hand, the device separation is carried out by using $B^+$ ion-implantation.

Figure 17A:
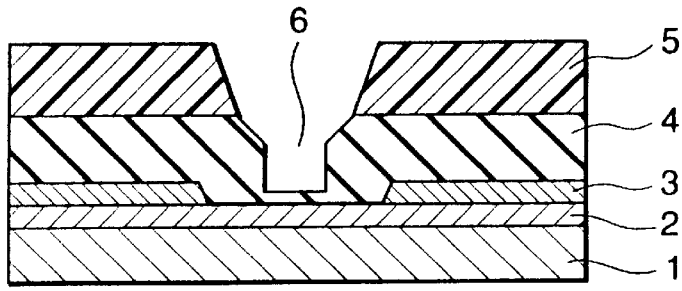
FIGS. 17A through 17F are cross sectional views showing a method of manufacturing a compound semiconductor device according to a ninth embodiment.

As illustrated in FIG. 17A, a silicon oxide film is deposited to the thickness of 700 nm as an insulating film 4 on an epitaxial growth substrate in which the device separation is carried out. Further, a photo-resist film 5 which has an opening having an opening width of 0.4 μm and has the film thickness of 1 μm is formed thereon. In this event, a reflection prevention film (not shown) is inserted below the photo-resist film 5 to improve exposure accuracy of the stepper.

Thereafter, a gate opening 6 having a slope portion on the upper portion is formed in the insulating film 4, like the fourth embodiment. Specifically, the insulating film 4 is opened to a preselected depth by the RIE method using $CF_4$ and $H_2$. Moreover, the insulating film 4 is thinned to the thickness of about 50 nm on the opening bottom surface by the use of the ECR dry etching in which a mixed gas containing $CF_4$ and oxygen $O_2$ of 30% is used. At the same time, the slope is formed on the upper portion of the opening of the gate opening 6. In this event, the lateral dimension of the opening bottom is widened to 0.5 µm.

Figure 17B:
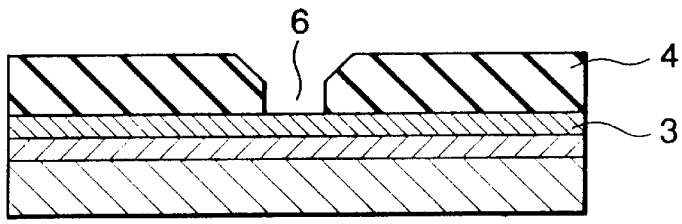

Subsequently, the photo-resist film 5 is removed by the use of the oxygen plasma process, as shown in FIG. 17B. After the organic washing process is performed, the insulating film 4 is etched to 100 nm by the ECR method dry-etching using $SF_6$ to expose a contact layer 3 from the gate opening. Thereafter, the crystal surface of the semiconductor is washed by the use of the organic washing and the dilution hydrochloric.

Figure 17C:
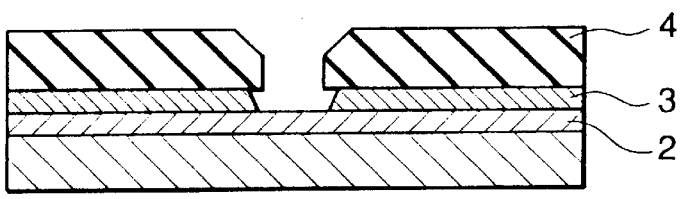

Next, the contact layer (n-type GaAs layer) 3 is etched by the use of the ECR method dry-etching, as illustrated in FIG. 17C. In this case, the etching is conducted by using a mixed gas of $BCl_3$ and $SF_6$ of 25% under the pressure of 1 mTorr. When the channel layer 2 (AlGaAs) is exposed, the etching for covering the surface of aluminum fluoride $AlF_X$ is halted. After the organic washing process is performed, the fluoride layer is removed by immersing it in the dilution hydrochloric for several minutes.

Figure 17D:
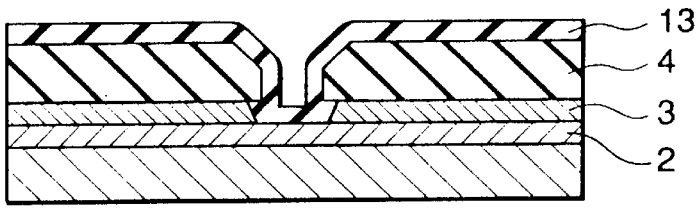

Subsequently, a $SiO_2$ film is deposited to the thickness of 300 nm as an insulating film 13 for forming a sidewall film, as illustrated in FIG. 17D. In this deposition, the lateral dimension of the opening bottom portion of the contact layer 3 becomes 0.1 µm. In this event, the thickness of the insulating film on the opening bottom portion becomes thinner that of the flat plane portion.

Figure 17E:
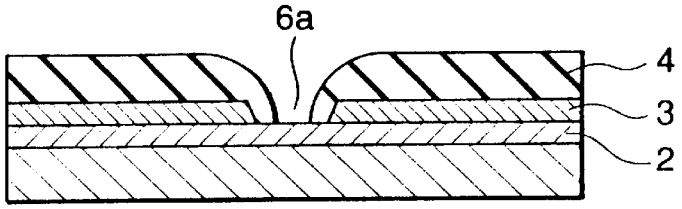

Successively, the $SiO_2$ film is etched on the opening bottom portion by the use of the RIE method using $CF_4$ gas and $H_2$ gas so that the $SiO_2$ film is left to about 100 nm, as shown in FIG. 17E. Thereafter, polymer or carbon is washed by the use of the oxygen plasma process and the organic washing process. Successively, the insulating film 4 is etched to 200 nm on the flat plane portion by the ECR method dry-etching using $SF_6$ gas. Thereby, the surface of the channel layer 2 is exposed from the gate opening 6. In this event, the dimension in the lateral direction as the gate length on the opening bottom portion becomes 0.2 µm.

Figure 17F:
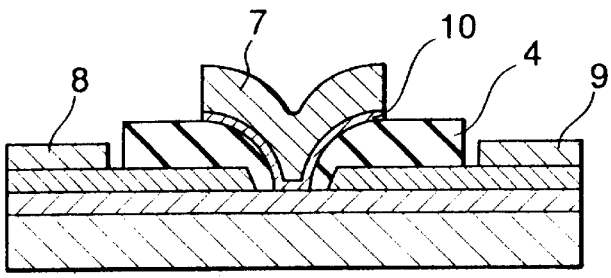

Subsequently, each electrode is formed like the first embodiment, as illustrated in FIG. 17F. Thus, the forming step of the FET is completed. In this condition, the gate electrode is separated in the self-alignment manner from the contact layer by the sidewall insulating film to be thinned. Further, the slope brings about on the upper portion of the gate opening 6a due to the withdraw in the lateral direction and the sidewall. Thereby, the embedding of the gate electrode is largely improved.

Under this circumstances, no etching defect occurs in the etching step (in FIG. 17C) of the contact layer using the insulating film 4 in which the gate opening 6 is formed as a mask because the reacted product is not attached.

The threshold voltage $V_T$ of the obtained FET was −1.20±0.15V (2σ) between batches due to the MOCVD growth and the internal of the wafer, and the maximum transconductance gm was 530 mS/mm at the average. Further, the standard deviation σ of $V_T$ inside the wafer surface was within the range between 40 mV and 80 mV As compared to the seventh embodiment, the uniformity and the reproducibility were slightly improved, and gm was also improved. This is because the source resistance is reduced by the self-alignment by the use of the sidewall insulating film.

In this case, although the recess is formed by the use of the dry-etching by arranging the etching halting layer at the intermediate portion of the semiconductor layer, the recess may be formed by the wet-etching without the halting layer.

(Tenth embodiment)

Like in the ninth embodiment, the opening is inevitably widened in the lateral direction in the etch-back of the insulating film under the dry-etching condition which has weak anisotropy and low damage. When the fine gate electrode of about 0.1 µm is formed, the accuracy of the final gate length is lowered by widening the opening. Consequently, the control of the insulating film processing step in the course must be enhanced. On the other hand, the grinding of the device semiconductor layer which is exposed at the step for forming opening in the insulating film is permitted because the etching halting layer of the device semiconductor layer is utilized in the ninth embodiment. Therefore, it is unnecessary to solve the defect in which the schottky barrier as mentioned in the conventional example is not formed.

Referring to FIGS. 18A through 18D and FIGS. 19A through 19C, description will be made about the tenth embodiment. Herein, it is to be noted that the connection of the fine electrode will be solved in the tenth embodiment. Further, the epitaxial growth substrate and the device separation due to $B^+$ ion-implantation are same as the ninth embodiment.

Figure 18A:
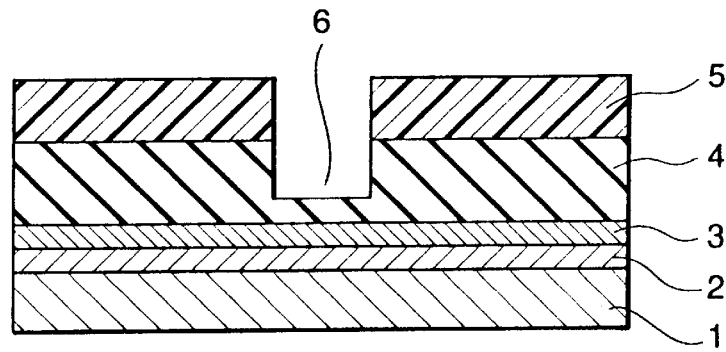
FIGS. 18A through 18D are cross sectional views showing a method of manufacturing a compound semiconductor device according to a tenth embodiment.

As illustrated in FIG. 18A, a silicon oxide film is deposited to the film thickness of 400 nm as a insulating film 4 on an epitaxial growth substrate in which the device separation is carried out. Thereafter, a photo-resist film 5 which has an opening having an opening width of 0.50 µm and has the thickness of about 1 µm is formed thereon. In this case, although the thickness of the silicon oxide film 4 is 700 nm in the ninth embodiment, the thickness is thinned without the etch back process in this embodiment.

Thereafter, the insulating film 4 is etched by the use of the RIE method using a mixed gas of $CF_4$ and $H_2$ having flow rate of 20% so that the insulating film 4 is left to half (180 nm). Thereby, the gate opening 6 is formed in the insulating film 4. In this event, the opening bottom portion is thinned to 0.44 µm because polymer is attached on the side surface of the gate opening 6.

Figure 18B:
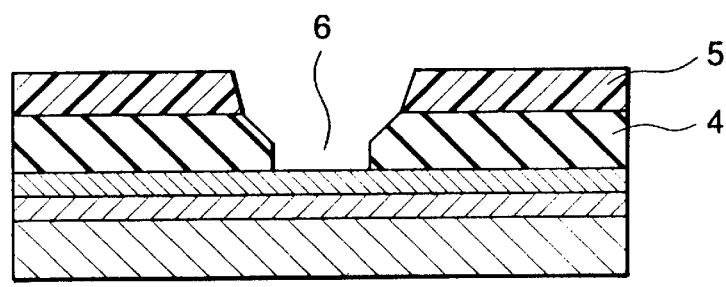

Subsequently, the silicon oxide film is etched to 270 nm by the ECR method dry etching using a mixed gas of $CF_4$ and oxygen $O_2$ of 30% under the pressure of 1 mTorr. Thereby, an n-type GaAs contact layer 3 is exposed on the bottom portion of the gate opening in the insulating film 4, as shown in FIG. 18B.

In this case, the dimension of the opening on the bottom portion in the insulating film 4 is 0.52 µm while it is 0.98 µm on the tapered upper portion. Further, the thickness of the insulating film 4 is thinned without the etch back so that the total etching quantity becomes small. Consequently, the widening in the lateral direction on the opening bottom portion is suppressed, and it is approximately identical with the film thickness dimension of the initial photo-resist. On the other hand, no carbon is attached to the exposed GaAs crystal surface because the etching gas contains oxygen. However, the surface is oxidized to several nm.

Figure 18C:
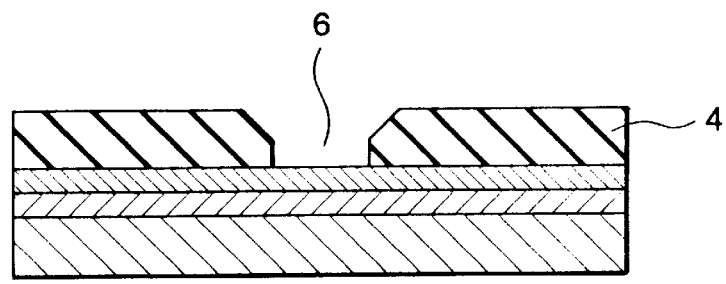

Subsequently, the remaining photo-resist film 5 is removed by the use of the ashing process due to the oxygen plasma, as illustrated in FIG. 18C. Thereafter, the washing process is carried out by the organic washing process and the dilution hydrochloric process. By this oxygen plasma process, the crystal surface of the n-type GaAs contact layer 3 is ground to about 10 nm with the dilution hydrochloric process. However, the original thickness of the contact layer 3 is 100 nm, and the contact layer 3 is almost left.

Figure 18D:
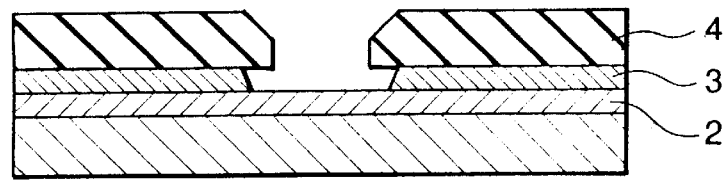

Next, the contact layer 3 (the n-type GaAs) is etched by the ECR method dry-etching using a mixed gas of $BCl_3$ and $SF_6$ of 25% under the pressure of 1 mTorr, as illustrated in FIG. 18D. When the channel layer (AlGaAs) is exposed, the aluminum fluoride is generated, and thereby the etching is halted. After the organic washing process is performed, the fluoride layer due to the dilution hydrochloric process is removed. This process corresponds to the step illustrated in FIG. 17C.

Figure 19A:
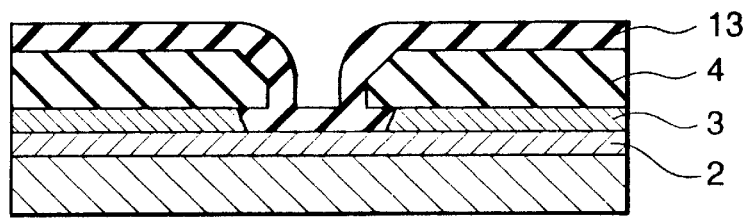
FIGS. 19A through 19C are cross sectional views showing a method of manufacturing a compound semiconductor device according to a tenth embodiment.

Subsequently, as illustrated in FIG. 19A, a $SiO_2$ is deposited to the thickness of 300 nm as an insulating film 13 for a sidewall film. In this event, the lateral direction dimension of the opening bottom portion which is newly formed in the opening in the contact layer 3 is equal to 0.24 μm in this deposition while the thickness of the $SiO_2$ in the vertical direction is equal to 220 nm.

Figure 19B:
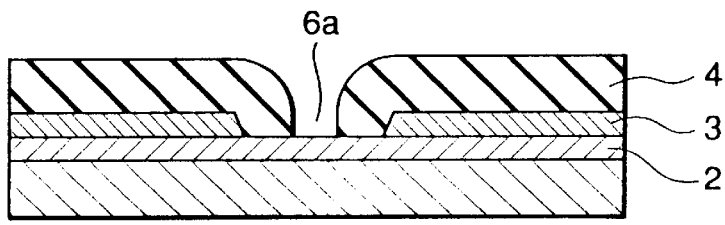

As shown in FIG. 19B, the $SiO_2$ film is etched by 150 nm by the RIE method in which $H_2$ of the flow rate having 20% is mixed with $CF_4$ so that the $SiO_2$ film is left about 100 nm at the opening bottom portion. Next, the polymer and the carbon are removed and washed by the use of the oxygen plasma process and the organic washing process. Successively, the insulating film 4 is etched with 200 nm at the flat portion by the ECR method dry-etching using $SF_6$ gas. Thereby, the channel layer 2 is exposed in the newly formed gate opening 6a. In this case, the lateral direction dimension as the gate length is equal to 0.22 μm at the opening bottom portion.

Figure 19C:
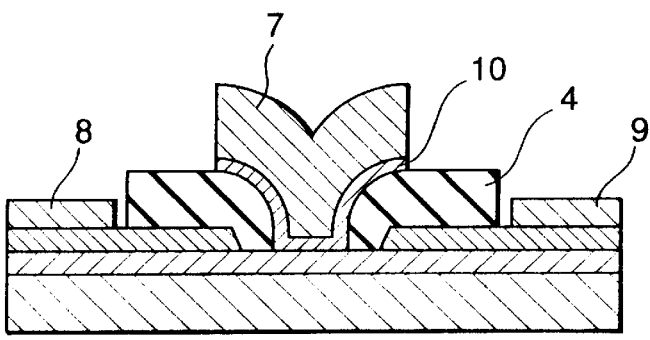

Subsequently, as illustrated in FIG. 19C, each electrode is formed like the first embodiment. Thereby, the FET is completed. In this event, pre-processing for vaporizing the gate metal by sputtering includes the organic washing process and the dilution hydrochloric process.

The lateral direction dimension of the opening bottom portion is equal to 0.22 μm, and the dimension continues with 0.16 μm in the vertical direction. Consequently, the opening is gradually widened towards the upper portion so that the dimension is equal to 0.9 μm at the highest portion. The gate electrode formed by WSi of 200 nm and Au of 600 nm is vaporized in the tapered opening to be embedded in the opening by the sputtering. As a result, the connection to the fine gate electrode is excellently carried out without the disconnection.

The accuracy of the gate length (2σ) including the manufacturing rots was ±0.026 μm and ±0.014 μm in the ninth and tenth examples. The initial thickness of the insulating film was thinned without the etch-back. Thereby, the widening of the lateral direction at the opening bottom portion was suppressed and the accuracy of the gate length was improved.

When the gate length is shortened, the gate capacitance is reduced and the cut-off frequency $f_T$ is improved. On the other hand, the gate reverse break-down voltage and the drain breakdown voltage are reduced, and the reliability of the device is also reduced. When the limit shortest gate length is selected from the reliability, the setting center must become large with the accuracy in the case of bad accuracy. Thereby, the high performance is degraded. Therefore, it is desirable that the accuracy of the gate length is high.

In the meanwhile, the average maximum cut-off frequency in the device having the gate length of 0.22 μm, $V_T$ of −1.1 V was equal to 90 GHz, the gate break-down voltage was −7V, and the drain break-down voltage of the three terminals was 6V.

The withdraw etching of the insulating film opening in the lateral direction is possible by increasing isotropic by enhancing the gas etching pressure without adding the oxygen, as mentioned in the fifth example. However, it is necessary to reduce the damage by lowering the ion-sheath voltage and by weakening the high frequency wave power to expose the crystal plane in the parallel plate type RIE, as described in the second example. On the other hand, the chlorine-based gas described in the sixth example can not be utilized in the tenth example because it etches the compound crystal. The usable gas is only fluorine-based gas, such as, $CF_4$, $SF_6$, and $NF_3$ which do not etch the compound crystal.

(Eleventh embodiment)

Although the single stage recess structure has been explained in the tenth embodiment, the double stage recess structure can be formed by digging the channel semiconductor layer before forming the gate electrode, as mentioned in the eighth embodiment.

Figure 20A:
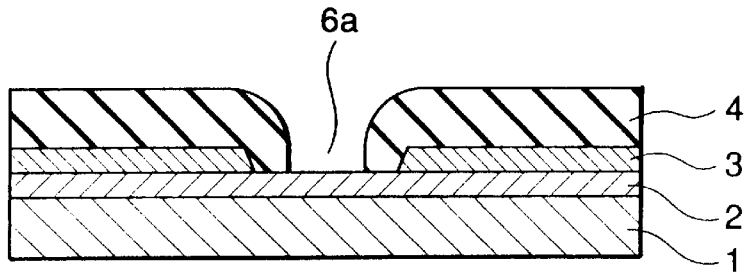
FIGS. 20A through 20C are cross sectional views showing a method of manufacturing a compound semiconductor device according to an eleventh embodiment.
Figure 20B:
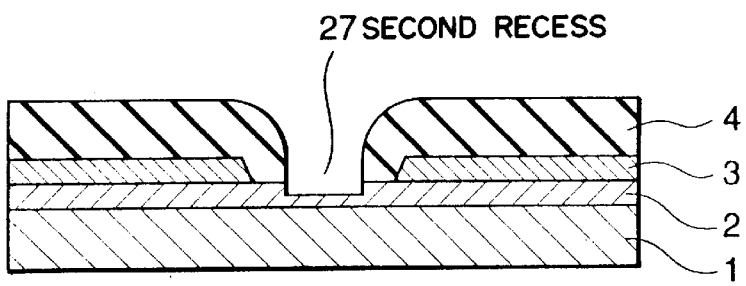
Figure 20C:
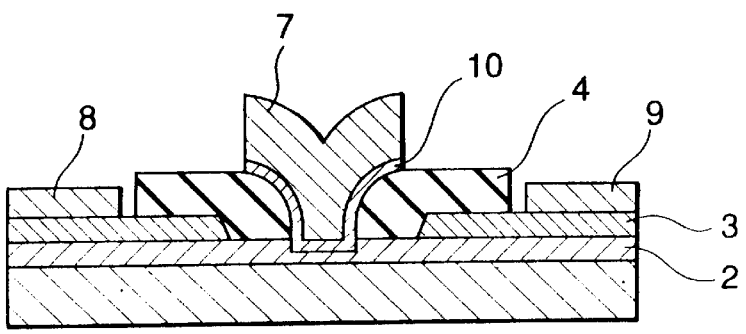

Referring to FIGS. 20A through 20C, description will be made about the eleventh embodiment.

An insulating film 4 is etched by the use of the ECR method dry-etching using $SF_6$ gas to expose the AlGaAs surface of the channel layer 2 from newly formed gate opening 6a. The surface is washed by the use of the organic washing process and the dilution hydrochloric process, as illustrated in FIG. 20A.

As shown in FIG. 20B, the n-type AlGaAs channel layer 2 is digged with 10 nm by the use of the wet-etching described in the eighth embodiment to form a second recess 27.

Subsequently, the formation step of the FET is completed by forming each electrode like the first embodiment, as illustrated in FIG. 20C.

The contamination and the grinding of the crystal are small before arranging the second recess like the eighth embodiment. Thereby, the depth of the second recess can be accurately formed in this embodiment. Further, the gate length can have the high accuracy like the tenth embodiment. Moreover, the gate opening is gradually widened towards the upper portion by the taper formation. Consequently, the connection to the fine gate electrode can be carried out without the disconnection.

Description has been made about a simple hetero-junction field effect transistor (HJFET) which has the conductive semiconductor layer and the two-dimensional electron gas in the hetero-junction interface with the buffer layer for the comparison with the comparative examples in the above-mentioned embodiments. Herein, the channel layer is uniformly doped in the above conductive semiconductor layer.

However, this invention is not limited to these embodiments, and is applicable for the other compound semiconductors, such as the other type FET, diodes and hole devices.

Further, although description has been made about the ECR method as the dry-etching method having the low damage, the ICP method and the helicon method may be used instead of the ECR method to obtain the same effect.

What is claimed is:

1. A method of manufacturing a semiconductor device having a semiconductor substrate, comprising the following sequential steps of:

(1) forming a channel layer on said semiconductor substrate;

(2) depositing an insulating film on said channel layer;

(3) forming a photo-resist film on said insulating film, said photo-resist film having a first opening corresponding to a gate electrode pattern;

(4) forming a second opening in said insulating film by the use of a first etching process by using said photo-resist film as a mask to control said insulating film thickness;

(5) removing said photo-resist film;

(6) etching the remaining insulating film by the use of a second etching process so as to expose said channel layer; and (7) forming said gate electrode pattern on said exposed channel layer.

2. A method as claimed in claim 1, wherein:

said second etching process is less damaging said semiconductor substrate than said first etching process.

3. A method as claimed in claim 1, wherein:

said first etching process comprises the reactive ion etching (RIE) method.

4. A method as claimed in claim 1, wherein:

said second etching process comprises at least one selected from the group consisting of the electron cyclotron resonance (ECR) method, the inductive coupled plasma (ICP) method and the helicon method.

5. A method as claimed in claim 1, wherein:

said second etching process comprises the reactive ion etching (RIE) method.

6. A method as claimed in claim 1, wherein:

said semiconductor substrate comprises either one of a GaAs substrate and an InP substrate.

7. A method as claimed in claim 1, wherein:

said photo-resist is removed by the use of oxygen plasma.

8. A method as claimed in claim 1, wherein:

said exposed channel layer constitutes a Schottky barrier with said gate electrode pattern.

9. A method as claimed in claim 1, further comprising the following step of:

forming a source electrode and a drain electrode at both sides of said gate electrode pattern.

10. A method of manufacturing a semiconductor device having a semiconductor substrate, comprising the following sequential steps of:

(1) forming a channel layer on said semiconductor substrate;

(2) depositing a first insulating film on said channel layer;

(3) forming a photo-resist film on said first insulating film, said photo-resist film having a first opening corresponding to a gate electrode pattern;

(4) forming a second opening in said insulating film by the use of a first etching process by using said photo-resist film as a mask to control said insulating film thickness;

(5) removing said photo-resist film;

(6) depositing a second insulating film on said first insulating film;

(7) etching said second insulating film to leave sidewall film; etching said remaining first insulating film by the use of a second etching process so as to expose said channel layer; and (8) forming said gate electrode pattern on said exposed channel layer.

11. A method as claimed in claim 10, wherein:

said sidewall film is formed so as to reduce said second opening in size.

12. A method as claimed in claim 10, wherein:

said side wall film constitutes a curve surface, and the curve surface is formed so that said second opening is filled with said gate electrode pattern to improve connection between said gate electrode pattern and said channel layer.

13. A method as claimed in claim 10, wherein:

said second etching process is lower in damage against said semiconductor substrate than said first etching process.

14. A method as claimed in claim 10, wherein:

said first etching process comprises the reactive ion etching (RIE) method.

15. A method as claimed in claim 10, wherein:

said second etching process comprises at least one selected from the group consisting of the electron cyclotron resonance (ECR) method, the inductive coupled plasma (ICP) method and the helicon method.

16. A method of manufacturing a semiconductor device having a semiconductor substrate, comprising the following sequential steps of:

forming a channel layer on said semiconductor substrate;

depositing an insulating film on said channel layer;

forming a photo-resist film on said insulating film, said photo-resist film having a first opening corresponding to a gate electrode pattern;

forming a second opening in said insulating film by the use of a first etching process by using said photo-resist film as a mask so that said insulating film is left with a first thickness;

forming a third opening having a slope in said insulating film by the use of a second etching process so that said insulating film is left with a second thickness;

removing said photo-resist film;

etching said remaining insulating film by the use of a third etching process so as to expose said channel layer; and forming said gate electrode pattern on said exposed channel layer.

17. A method as claimed in claim 16, wherein:

said slope is formed so that said third opening is filled with said gate electrode pattern to improve connection between said gate electrode pattern and said channel layer.

18. A method as claimed in claim 16, wherein:

said first etching process comprises the reactive ion etching (RIE) method while each of said second etching process and said third etching process comprises the electron cyclotron resonance (ECR) method.

19. A method as claimed in claim 16, wherein:

each of said first etching process and second etching process comprises the reactive ion etching (RIE) method while said third etching process comprises the electron cyclotron resonance (ECR) method.

20. A method of manufacturing a semiconductor device having a semiconductor substrate, comprising the following sequential steps of:

(1) forming a channel layer on said semiconductor substrate;

(2) depositing a first insulating film on said channel layer;

(3) forming a photo-resist film on said first insulating film, said photo-resist film having a first opening corresponding to a gate electrode pattern;

(4) forming a second opening in said insulating film by the use of a first etching process by using said photo-resist film as a mask so that said insulating film is left with a first thickness;

(5) forming a third opening having a slope in said insulating film by the use of a second etching process so that said insulating film is left with a second thickness;

(6) removing said photo-resist film;

(7) depositing a second insulating film on said first insulating film;

(8) etching said second insulating film to leave sidewall films;

(9) etching said remaining insulating film by the use of a third etching process so as to expose said channel layer; and

(10) forming said gate electrode pattern on said exposed channel layer.

21. A method as claimed in claim 20, wherein:

said side wall film constitutes a curve surface, and the curve surface is formed so that said third opening is filled with said gate electrode pattern to improve connection between said gate electrode pattern and said channel layer.

22. A method as claimed in claim 20, wherein:

said slope is formed so that said third opening is filled with said gate electrode pattern to improve connection between said gate electrode pattern and said channel layer.

23. A method as claimed in claim 20, wherein:

said first etching process comprises the reactive ion etching (RIE) method while each of said second etching process and said third etching process comprises the electron cyclotron resonance (ECR) method.

24. A method of manufacturing a semiconductor device which has a semiconductor substrate, a channel layer formed on said semiconductor substrate and an insulating film deposited on said channel layer, wherein:

an opening corresponding to a gate electrode pattern is formed in said insulating film by the use of a photo-resist film, said channel layer contains Ga and As as crystal components while said photoresist film contains carbon, and said insulating film is etched to exposed said channel layer after removing said photo-resist film so that no reacted product is formed between the crystal components and the carbon on the exposed channel layer.

25. A method of manufacturing a semiconductor device having a semiconductor substrate, consisting essentially of the following steps of:

(1) depositing an insulating film over said semiconductor substrate;

(2) forming a photo-resist film on said insulating film, said photo-resist film having an opening;

(3) forming a vertical opening in said insulating film by anistropically etching the insulating film by using said photo-resist film as a mask to control said insulating film thickness;

(4) next forming a slope at an upper portion of the insulating film by removing the photo-resist film to form a sloping side surface of said vertical opening; and (5) removing said photo-resist film.

26. A method as claimed in claim 25, wherein:

removing said photo-resist film uses a gas that includes $SF_6$.

27. A method as claimed in claim 25, wherein:

removing said photo-resist film uses a gas that includes $NF_3$.

28. A method as claimed in claim 25, wherein:

removing said photo-resist film uses a gas that includes oxygen.

29. A method as claimed in claim 25, wherein:

removing said photo-resist film uses a gas that includes $BCl_3$.

* * * * *

UNITED STATES PATENT AND TRADEMARK OFFICE
CERTIFICATE OF CORRECTION

PATENT NO. : 6,159,861
DATED : December 12, 2000
INVENTOR(S) : Shuji Asai, Hirokazu Oikawa Page 1 of 1

It is certified that error appears in the above-identified patent and that said Letters Patent is hereby corrected as shown below:

Column 1,
Line 12, delete "I" insert -- / --

Column 4,
Line 56, delete "provide" insert -- provided --

Column 7,
Line 56, delete "provide" insert -- provided --

Column 8,
Line 2, delete "CHF" insert -- $CHF_3$ --

Column 11,
Line 1, delete "$cm^{-8}$" insert -- $cm^{-3}$ --;
Line 27, delete "+0.15V" insert -- ±0.15V. --

Column 14,
Line 12, delete "a" insert -- σ --

Signed and Sealed this

Eleventh Day of September, 2001

*Attest:*

NICHOLAS P. GODICI
*Attesting Officer*  *Acting Director of the United States Patent and Trademark Office*